(12) United States Patent
Sakato et al.

(10) Patent No.: US 11,550,546 B2
(45) Date of Patent: Jan. 10, 2023

(54) PROCESSING APPARATUS, METHOD OF CONTROLLING THE SAME, AND NON-TRANSITORY COMPUTER READABLE STORAGE MEDIUM

(71) Applicant: CANON KABUSHIKI KAISHA, Tokyo (JP)

(72) Inventors: Kazuma Sakato, Kawasaki (JP); Yohei Horikawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 487 days.

(21) Appl. No.: 16/839,327

(22) Filed: Apr. 3, 2020

(65) Prior Publication Data

US 2020/0319852 A1 Oct. 8, 2020

(30) Foreign Application Priority Data

Apr. 8, 2019 (JP) .............................. JP2019-073720

(51) Int. Cl.
| | | |
|---|---|---|
| *G06F 7/57* | (2006.01) | |
| *G11C 11/419* | (2006.01) | |
| *G11C 11/418* | (2006.01) | |

(52) U.S. Cl.
CPC .............. *G06F 7/57* (2013.01); *G11C 11/418* (2013.01); *G11C 11/419* (2013.01)

(58) Field of Classification Search
CPC ....................................................... G06F 7/57
See application file for complete search history.

(56) References Cited

U.S. PATENT DOCUMENTS

| | | | | |
|---|---|---|---|---|
| 2006/0195684 A1* | 8/2006 | Fukatsu | .............. | G06F 15/8007 712/228 |
| 2007/0198619 A1* | 8/2007 | Kasama | .............. | G06F 15/8015 708/200 |
| 2013/0002292 A1* | 1/2013 | Higuchi | .............. | G06F 15/7867 326/37 |
| 2014/0237227 A1* | 8/2014 | Aizawa | ................ | G06F 1/3287 713/100 |

FOREIGN PATENT DOCUMENTS

| | | |
|---|---|---|
| JP | 2006-025379 A | 1/2006 |
| JP | 2010-244238 A | 10/2010 |

\* cited by examiner

*Primary Examiner* — Chuong D Ngo
(74) *Attorney, Agent, or Firm* — Cowan, Lebowitz & Latman, P.C.

(57) ABSTRACT

A processing apparatus having a programmable circuit including a plurality of ALUs, comprises a holding unit which holds configuration information for switching the programmable circuit from a first circuit setting to a second circuit setting, and timing information; and an updating unit which updates each ALU so as to switch the programmable circuit from the first circuit setting to the second circuit setting, wherein in switching from the first circuit setting to the second circuit setting after the programmable circuit has executed the first data processing, the updating unit, using the timing information, updates the first ALU at a timing at which last data of the first data processing is output from the first ALU, and updates the second ALU at a timing at which the last data is output from the second ALU.

10 Claims, 25 Drawing Sheets

FIG. 4A
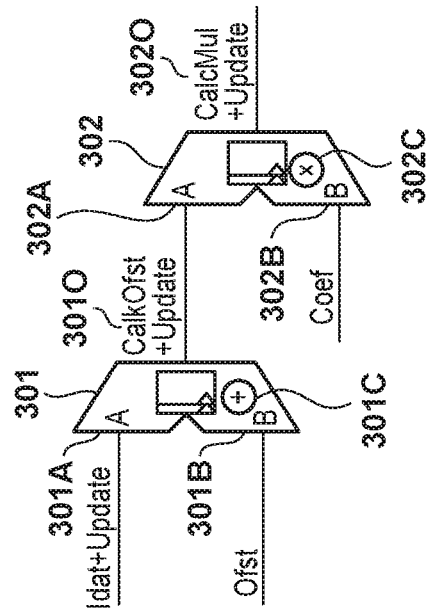
PROCESSING CIRCUIT 2 (10 CYCLES)
DEFOCUS AMOUNT ESTIMATION CIRCUIT
SWITCH
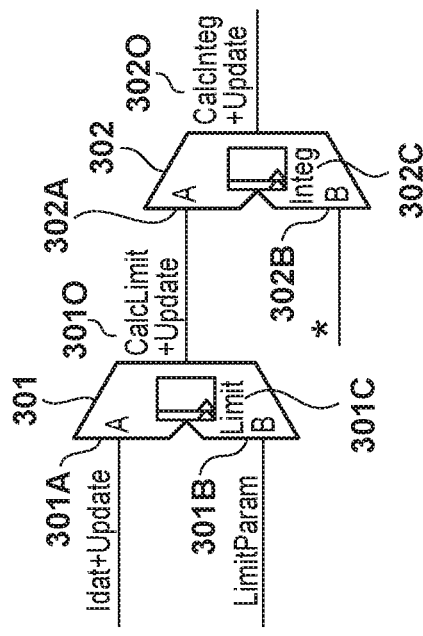
PROCESSING CIRCUIT 1 (10 CYCLES)
CORRELATION COMPUTATION CIRCUIT FIG. 5A
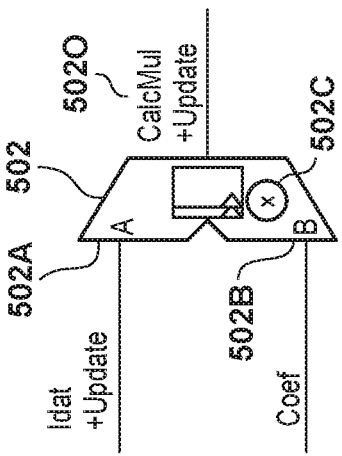
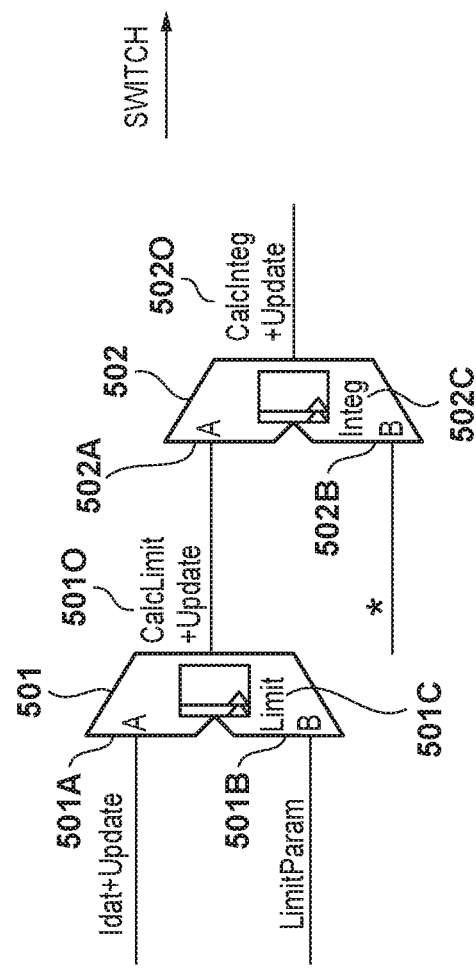

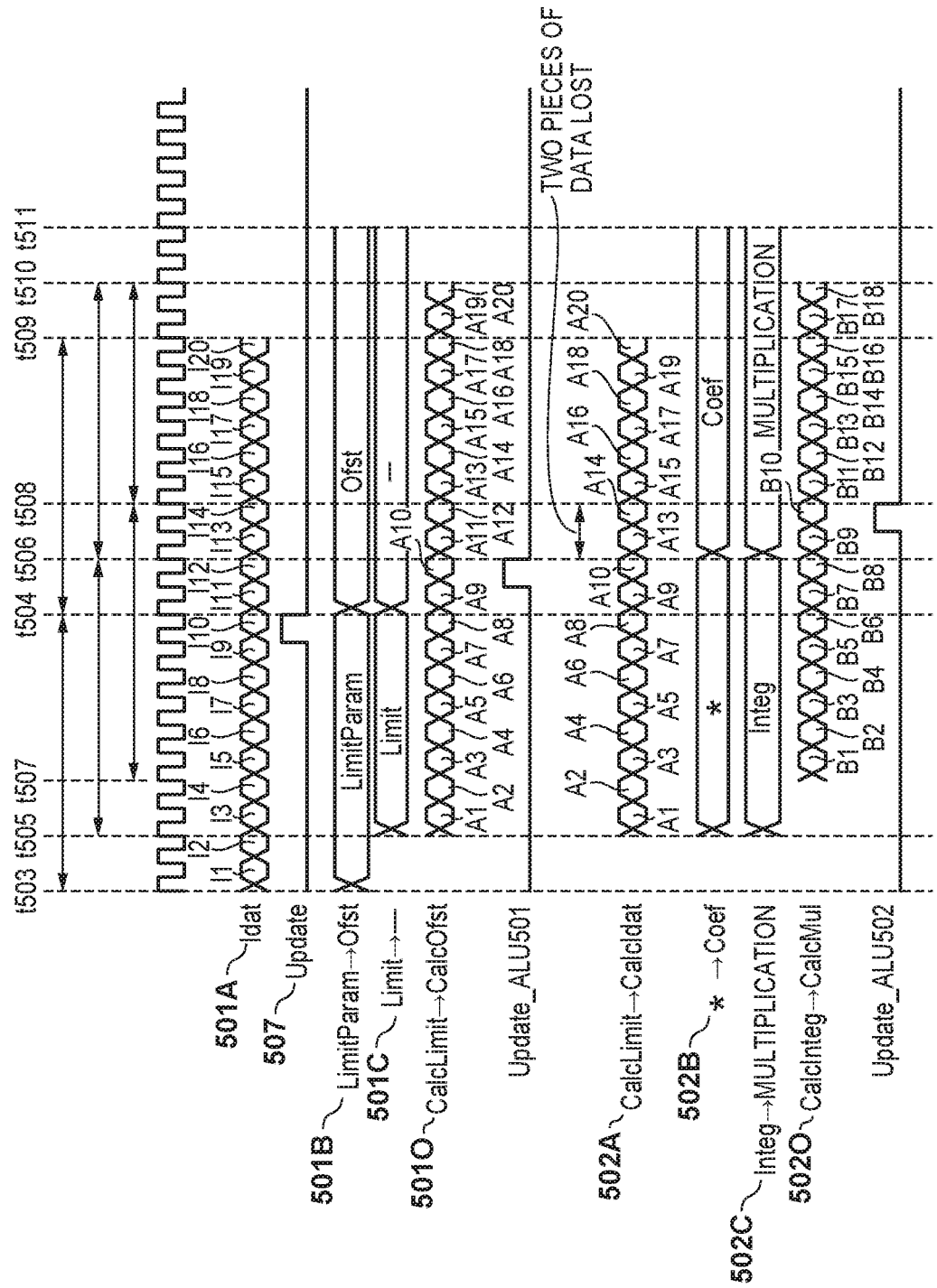

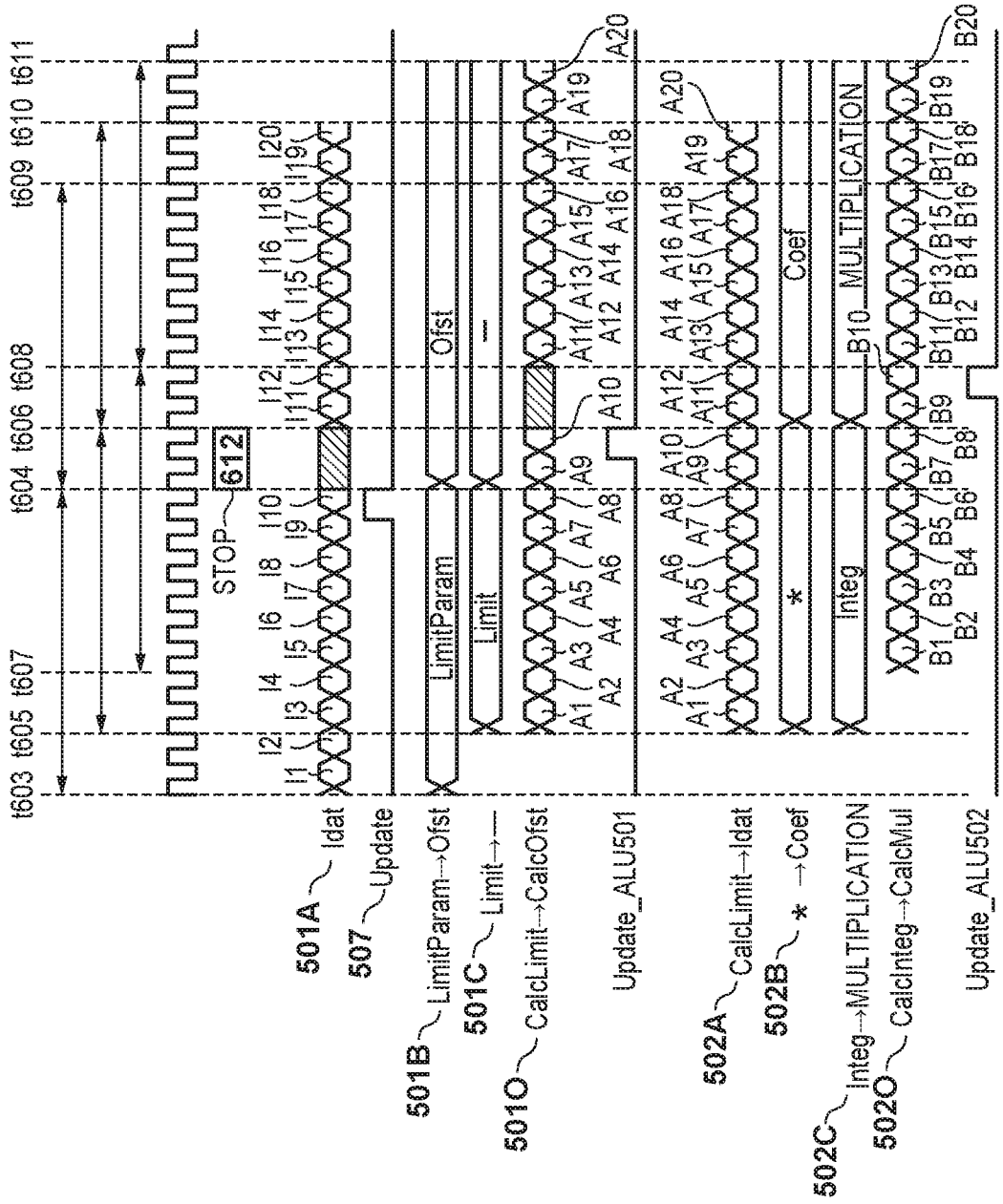

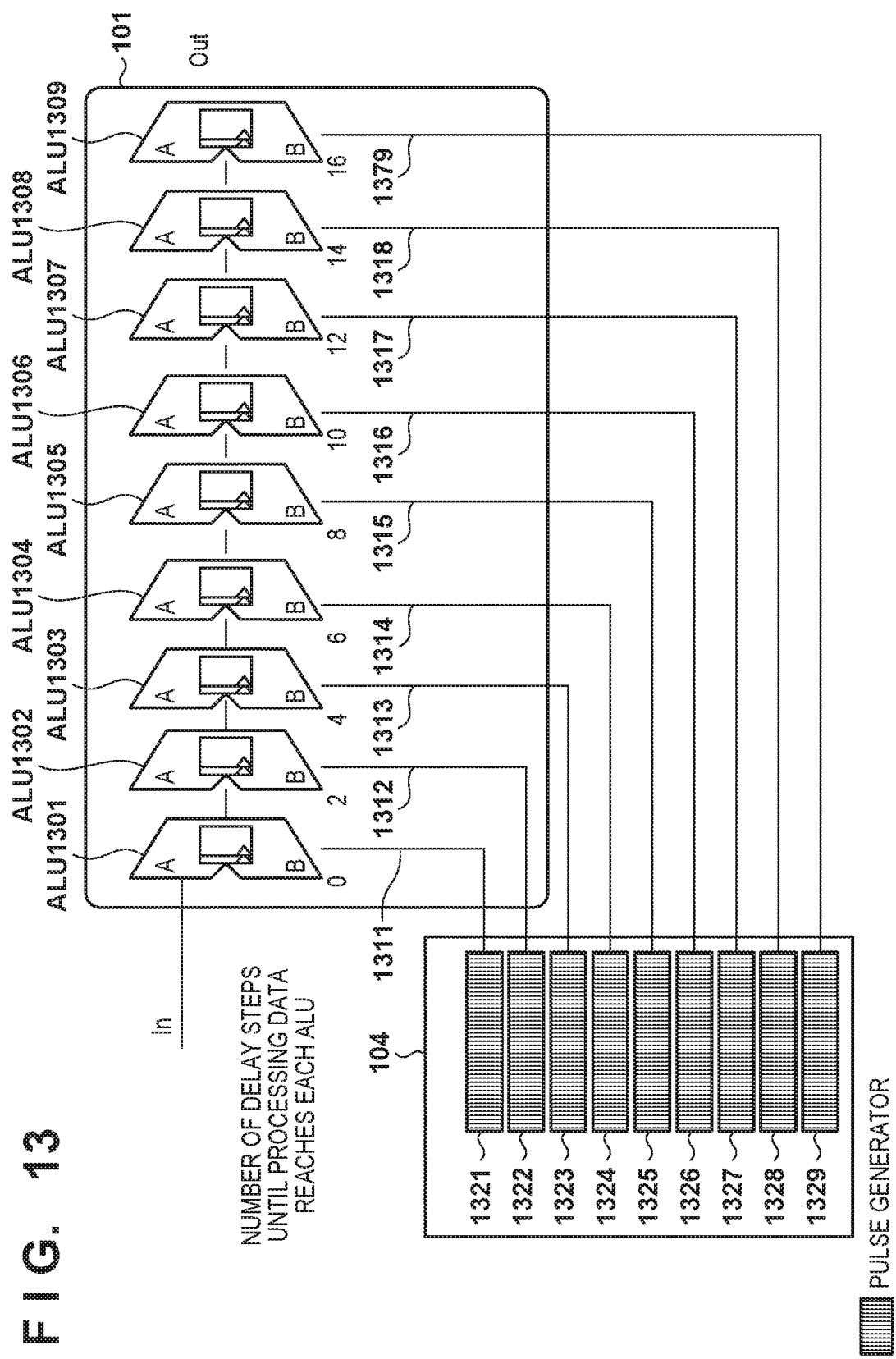

PROCESSING APPARATUS, METHOD OF CONTROLLING THE SAME, AND NON-TRANSITORY COMPUTER READABLE STORAGE MEDIUM

BACKGROUND OF THE INVENTION

Field of the Invention

The present invention relates to a processing apparatus including a programmable circuit, a method of controlling the same, and a non-transitory computer-readable storage medium.

Description of the Related Art

A programmable circuit with freely-configurable internal functions, such as an FPGA (Field Programmable Gate Array) and a PLD (Programmable Logic Device), is known. In such a programmable circuit, desired processing circuits can be realized using, for example, ALUs (Arithmetic and Logic Units), which are a plurality of element circuits internally provided. Also, in such a programmable circuit, processing circuits can be switched by rewriting configuration information that defines the functions of ALUs. For example, according to Japanese Patent Laid-Open No. 2006-25379, processing circuits are switched by propagating configuration information to each ALU using a configuration of a shift register. Furthermore, each ALU is configured to perform the rewrite only when configuration information is permitted to be rewritten; in this way, only desired ALUs can rewrite configuration information.

On the other hand, Japanese Patent Laid-Open No. 2010-244238 discloses a programmable circuit that uses a memory, such as an SRAM, in computation.

In rewriting configuration information, it is necessary to perform the rewrite after processing circuits complete all computations of input signals and output the computation results in order to prevent damage of data that has not been output yet. That is to say, it is necessary to stop input until data output is finished, thereby making it difficult to improve throughput.

SUMMARY OF THE INVENTION

The present invention has been made in view of the foregoing problem, and aims to provide a technique to improve throughput of a programmable circuit.

According to an aspect of the invention, there is provided a processing apparatus comprising: a programmable circuit having ALUs (Arithmetic and Logic Units) including a first ALU and a second ALU that is located on a downstream side compared to the first ALU, and configured to perform first data processing and second data processing; and an updating unit configured to update the first ALU and the second ALU, so as to switch the programmable circuit from the first circuit setting for the first data processing to the second circuit setting for the second data processing, wherein, in case of switching the programmable circuit from the first circuit setting to the second circuit setting after the programmable circuit has executed the first data processing under the first circuit setting, the updating unit updates the first ALU at a timing at which last data of the first data processing is output from the first ALU, and updates the second ALU at a timing at which the last data is output from the second ALU.

According to the present invention, throughput of a programmable circuit can be improved when multiple types of processing are performed using the programmable circuit.

Further features of the present invention will become apparent from the following description of exemplary embodiments (with reference to the attached drawings).

BRIEF DESCRIPTION OF THE DRAWINGS

FIG. 4A is a diagram exemplarily showing switching of a programmable circuit according to the first embodiment.

FIG. 5A is a diagram exemplarily showing conventional switching of a programmable circuit.

FIG. 5B is a timing chart of switching of FIG. 5A.

FIG. 6B is a timing chart of switching of FIG. 6A.

FIG. 13 is a diagram showing structures of a timing control unit and the programmable circuit according to the fourth embodiment.

DESCRIPTION OF THE EMBODIMENTS

The following describes embodiments in detail with reference to the attached drawings. Note that the following embodiments do not limit the invention pertaining to the claims. Although the embodiments describe a plurality of characteristics, all of these plurality of characteristics are not necessarily indispensable for the invention, and the plurality

First Embodiment

Figure 1:
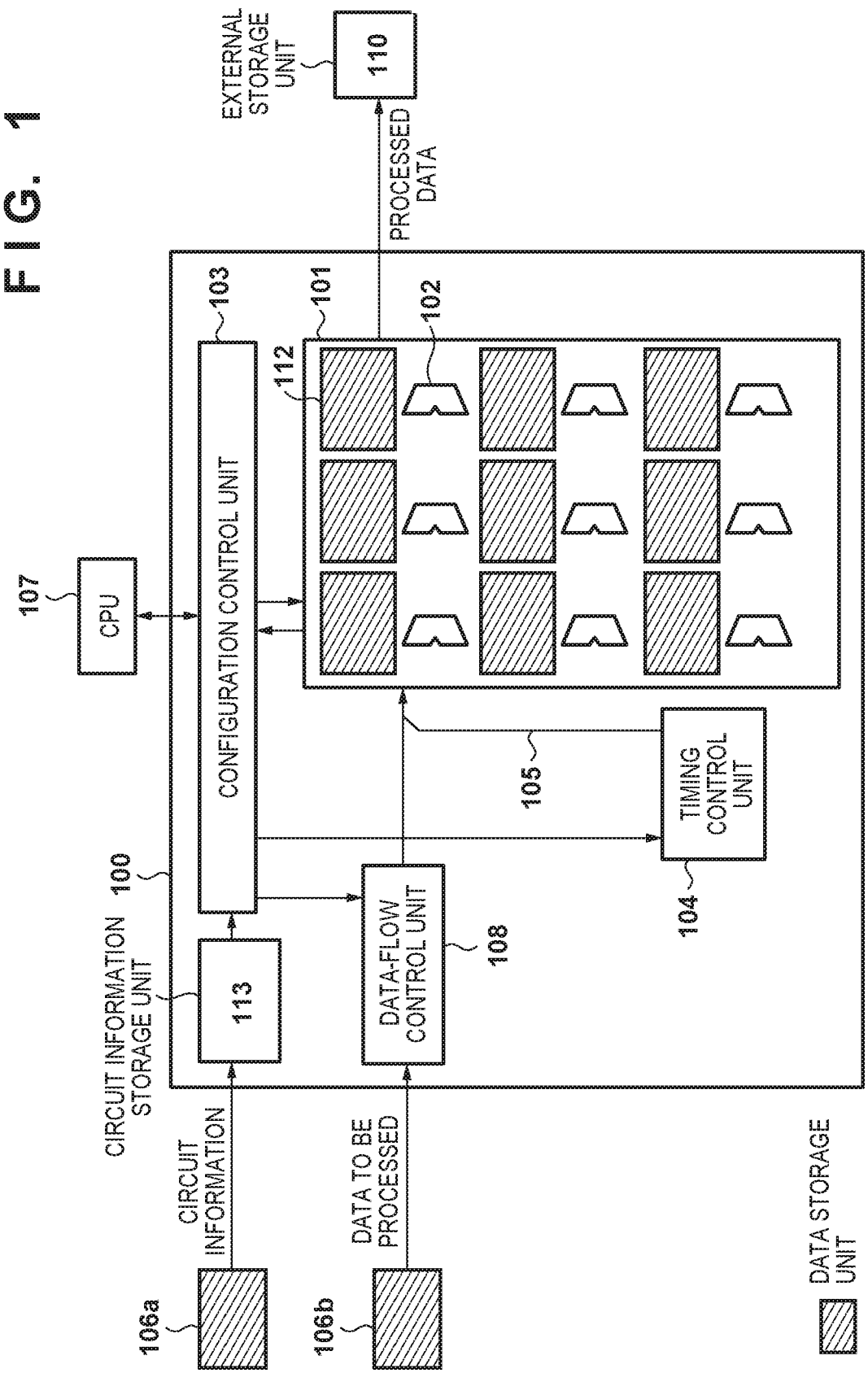
FIG. 1 is a block diagram showing a signal processing apparatus according to a first embodiment.

FIG. 1 is a block configuration diagram of an information processing apparatus according to a first embodiment. The present apparatus includes a CPU 107 that takes charge of control over the entire apparatus, data storage units 106a, 106b, a signal processing apparatus 100, and an external storage unit 110.

The signal processing apparatus 100 is composed of a programmable circuit unit 101, a configuration control unit 103, a circuit information storage unit 113, a timing control unit 104, and a data-flow control unit 108.

The programmable circuit unit 101 is composed of, for example, an FPGA or a PLD, is composed of a plurality of data storage units 112 that hold configuration information and a plurality of ALUs (Arithmetic and Logic Units) 102 that serve as element circuits (units of processing), receives processing data held in the data storage unit 106b as data to be processed as input, and performs signal processing. The data storage units 112 are registers that hold configuration information passed from the configuration control unit 103. The ALUs 102 are two-input one-output logic arithmetic devices, and can select two signals from among a plurality of signals based on the configuration information held in the data storage units 112 and perform desired computations, such as addition and subtraction, for example. Desired processing circuits can be realized by combining such ALUs 102.

The circuit information storage unit 113 is a storage unit, such as an SRAM, that holds circuit information held in the data storage unit 106a. The configuration control unit 103, which will be described later, refers to the circuit information multiple times. Storing the circuit information into the circuit information storage unit 113 inside the signal processing apparatus 100 in advance enables the configuration control unit 103 to read out the circuit information at high speed.

The configuration control unit 103 reads out the circuit information held in the circuit information storage unit 113. Then, the configuration control unit 103 decodes the circuit information that has been read out. As a result of this decoding, configuration information, as well as timing information that is included in the configuration information and indicates rewrite timings for respective types of setting information, is obtained. The configuration control unit 103 transfers the obtained configuration information to the data storage units 112, and sets the timing information in the timing control unit 104 to define a timing at which a rewrite signal 105 is generated by the timing control unit 104. The configuration control unit 103 also sets control information that is necessary for flow control of input processing data in the data-flow control unit 108, which will be described later.

Under control of the configuration control unit 103, the timing control unit 104 generates a pulsed rewrite signal 105, which will be described later, at an arbitrary timing, and propagates the same in synchronization with input data to be processed.

The rewrite signal 105 is a load signal that gives notice of a timing to update configuration information of the plurality of ALUs 102, and is propagated in synchronization with an input signal.

Regarding a timing to generate the rewrite signal 105, it is desirable to issue the same at the last processing timing of data processed in a desired processing circuit. With the issuance at the last processing timing of data to be processed, configuration information can be updated after each ALU has completed processing corresponding to a desired number of data pieces.

The data-flow control unit 108 controls processing data that is input/output to the programmable circuit unit 101. This data-flow control unit 108 performs flow control over input processing data based on the control information passed from the configuration control unit 103.

The data storage unit 106a is temporary storage means that stores circuit information used in the signal processing apparatus 100 of the present embodiment, and is composed of an SRAM and the like.

The data storage unit 106b is temporary storage means that stores processing data used in the signal processing apparatus 100 of the present embodiment, and is composed of an SRAM and the like. The data storage unit 106b also provides a working area for the CPU 107, which will be described later.

The CPU 107 is a control unit, such as a processor, that executes arithmetic processing and control processing in accordance with programs. Various types of signal processing are executed by various types of programs stored in a non-illustrated storage unit.

The external storage unit 110 is a data holding unit capable of recording data of a CF (CompactFlash®), an SD card, and the like.

Figure 9:
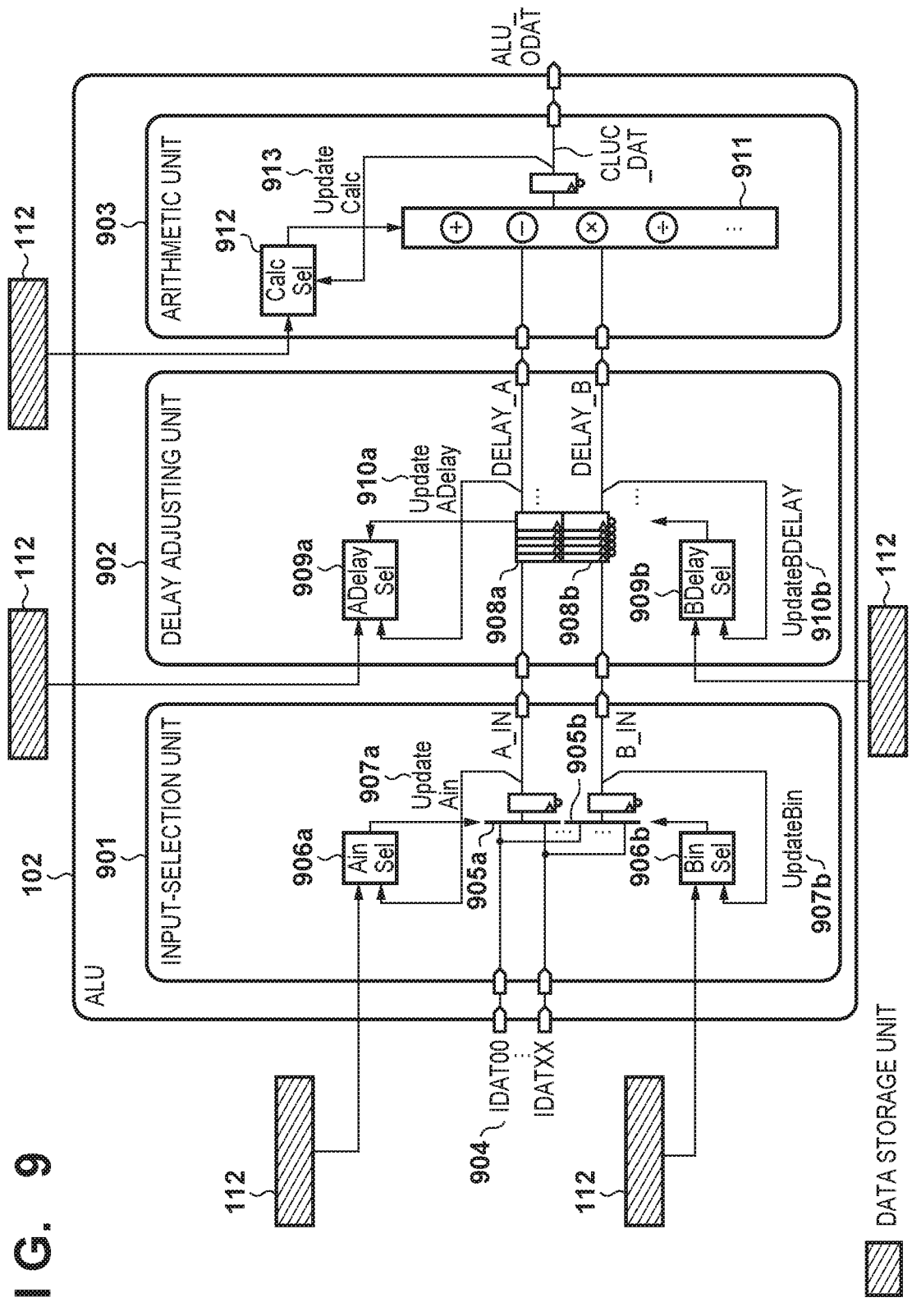
FIG. 9 is a block diagram showing a configuration of an ALU according to an embodiment.

Next, an internal configuration of an ALU 102 is described using FIG. 9. An ALU 102 is composed of an input-selection unit 901, a delay adjusting unit 902, and an arithmetic unit 903, and functions as a two-input one-output computational arithmetic circuit. Each input can be independently adjusted in terms of a delay amount, and the configuration makes uniform the delays of input signals that are selected immediately before an internal arithmetic device.

In accordance with data held in the data storage units 112, the input-selection unit 901 selects two signals to be used in the ALU 102 from among a plurality of signals 904. The plurality of signals 904 can be obtained by, for example, selecting one of processing data input from the data storage unit 106b and output signals of a plurality of ALUs 102. The selected signals are represented as A-side input data A_IN and B-side input data B_IN, respectively. An A-side input selector 905a selects one of the plurality of input signals based on a setting value of an A-side input data selection register AinSel 906a, and outputs the selected signal as A_IN to the delay adjusting unit 902. A B-side input selector 905b selects one of the plurality of input signals based on a setting value of a B-side input data selection register BinSel 906b, and outputs the selected signal as B_IN to the delay adjusting unit 902.

Each of the plurality of input data selection registers 906a, 906b, 909a, 909b, 912 that exist inside the ALU 102 is a register that holds a setting value of a selector that selects a signal. These setting values in the plurality of registers are configuration information held in the data storage units 112.

The input data selection registers 906a, 906b that hold settings for selecting input data refer to rewrite signals 105 that are propagated in synchronization with signals that have been output from the selectors 905a, 905b corresponding to the input data selection registers 906a, 906b. When these rewrite signals 105 are High, setting values held in the data storage units 112 are loaded to the input data selection registers 906a, 906b. For example, the A-side input data selection register 906a refers to a rewrite signal 907a that is propagated in synchronization with the signal A_IN, and sets a setting value held in a data storage unit 112 when 907a is High.

By thus delaying the rewrite signals 105, setting values can be updated at a timing of arrival of the last data pieces of the respective registers, or at a timing of arrival of the first data to which the next circuit setting is applied.

The delay adjusting unit 902 makes a delay adjustment to the input signals A_IN and B_IN selected by the input-selection unit 901. The delay adjusting unit 902 includes multi-step delay elements 908a, 908b, and constitutes a shift register; in this way, a multi-step delay adjustment can be realized. By setting an A-side delay selection register 909a, the output of the delay element 908a with a desired number of steps is output as a signal DELAY_A to the arithmetic unit 903 of the subsequent stage. Similarly, by setting a B-side delay selection register 909b, the output of the delay element 908b with a desired number of steps is output as a signal DELAY_B to the arithmetic unit 903 of the subsequent stage.

The arithmetic unit 903 performs predetermined computation using the two input signals DELAY_A, DELAY_B to which a delay adjustment has been made. The arithmetic devices that are shown in the figure are examples of the present embodiment, and no limitation is intended regarding what kind of arithmetic devices are actually installed. For example, other than the four arithmetic operations, logical operators AND and OR, a comparison operator, and the like may be installed. Furthermore, a bit-shifting mechanism may be provided after the arithmetic devices. An arithmetic result selection selector 911 selects an arithmetic result based on a setting value of an arithmetic result selection register 912, and outputs the selected arithmetic result as the output of the ALU 102 to the subsequent stage.

The programmable circuit unit 101 realizes a desired processing circuit by combining a plurality of ALUs 102 described above. Now, a pulse generation circuit is illustrated in FIG. 10 as one example of the processing circuit.

Figure 10:
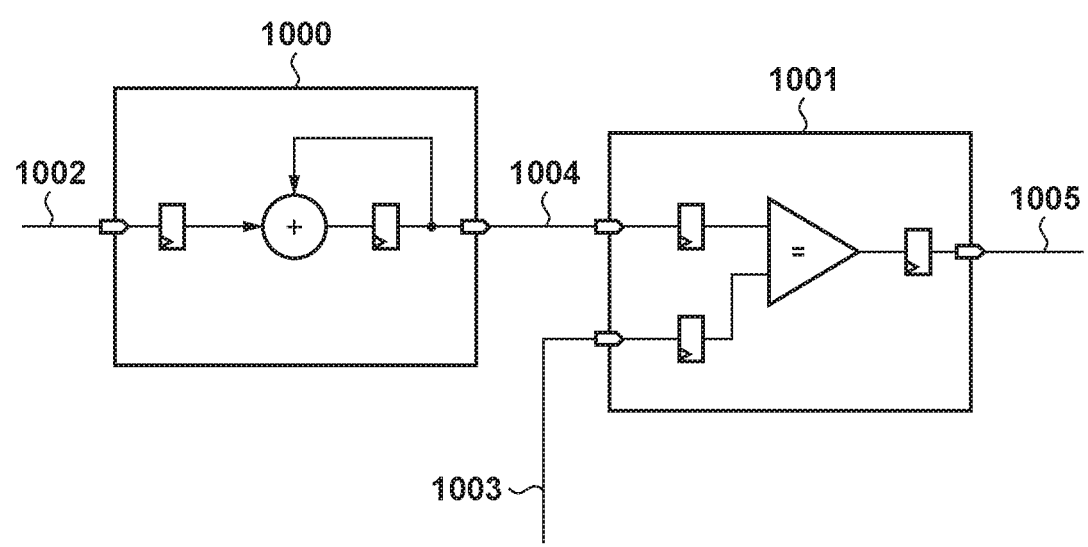
FIG. 10 is a block diagram showing a configuration of a pulse generation circuit realized by ALUs according to an embodiment.

FIG. 10 shows a pulse generation circuit that is made using two ALUs 102. Reference numerals 1000 and 1001 are exemplary representations of arithmetic circuits that are obtained by setting configuration information in the foregoing ALUs 102. The arithmetic circuits 1000 and 1001 are connected by a line 1004.

The ALU 1000 realizes a counter (an accumulation circuit), and uses only one input out of two inputs. A counter configuration that increments can be realized by using a fixed value 1 as an input signal 1002.

The ALU 1001 constitutes a comparator, and outputs a pulse signal 1005 in a High state when a count value from the ALU 1000 is equivalent to a compared value 1003.

By combining ALUs in the above-described manner, a desired circuit, such as a pulse generation circuit, can be realized.

<Example of Processing of Programmable Circuit>

The present embodiment is described using an example in which a programmable circuit is used in implementing a part of a processing flow from the obtainment of defocus amounts to the formation of a distance map based on a pupil division method that uses divided pixels on an image sensor. It is assumed that known techniques are used with respect to the configuration of the image sensor having divided pixels and the method of obtaining a distance map corresponding to parallax images, and their descriptions are omitted.

Figure 2:
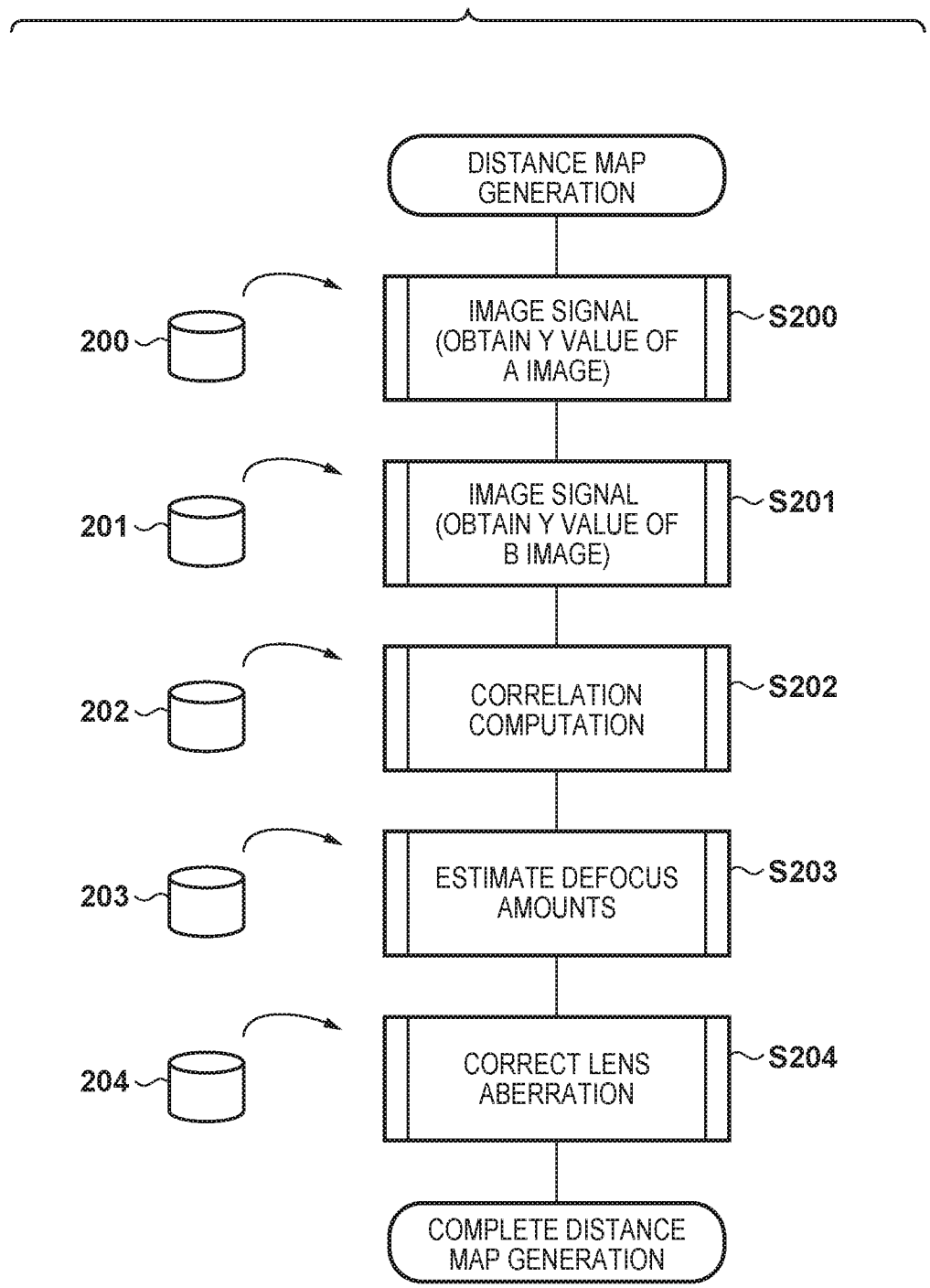
FIG. 2 is a flowchart showing operations of the signal processing apparatus according to the first embodiment.

FIG. 2 is a flowchart of processing for generating a distance map by detecting defocus amounts from parallax images. As the obtainment of parallax pixels from an image capturing plane and the generation of a distance map are conventional techniques and do not affect the main idea of the present invention, their descriptions are omitted. The following exemplarily describes propagation of a circuit rewrite signal 105 when a part of arithmetic processing for obtaining a distance map is implemented using a programmable circuit. In the present embodiment, it is assumed that parallax images are obtained by dividing pixels in halves and are defined as an A image and a B image, respectively.

In step S200, luminance values (hereinafter referred to as Y values) are obtained from a signal of the A image. In step S201, Y values are similarly obtained from a signal of the B image as well. In step S202, correlation of parallax differences is computed from the Y values obtained in steps S200 and S201. In step S203, defocus amounts are estimated from an amount of relative image shift due to the parallax differences, which has been obtained through the correlation computation of step S202. In step S204, unevenness in the defocus amounts on a plane caused by lens aberration is corrected.

In the present embodiment, each time the type of processing changes as in the foregoing steps S200 to S204, the ALU configuration within the programmable circuit unit 101 is switched, and thus pieces of circuit information 200 to 204 are set in steps S200 to S204, respectively. The pieces of circuit information 200 to 204 are stored into the data storage unit 106a of FIG. 1 in advance. When the programmable circuit unit 101 is initialized, the pieces of circuit information 200 to 204 are transferred to the circuit information storage unit 113 under control of the CPU 107.

The configuration control unit 103 decodes the circuit information 200, and passes values to be set in the input data selection registers 906a, 906b of FIG. 9 to each ALU 102. Registers pertaining to a circuit configuration of the programmable circuit unit 101 have a double-buffer configuration of a primary register, such as the data storage units 112, and a secondary register, such as the input data selection registers 906a, 906b. The configuration control unit 103 causes the values that have been passed to the primary registers based on the circuit information 200 to be transferred to the secondary registers installed in each ALU 102. Then, after the transfer is completed, the configuration control unit 103 requests the circuit information storage unit 113 to transfer the circuit information 201 in order to update the primary registers to the next circuit information.

A timing at which the secondary registers existing within each ALU 102 update a setting value is a timing at which a rewrite signal, which is propagated in synchronization with an output signal of a selector that has been set in each setting register, arrives at each setting register. The rewrite signal is generated by the timing control unit 104 at an arbitrary timing, and is propagated in synchronization with an input signal of the programmable circuit unit 101. In this way, in a cycle next to the completion of processing under the first circuit setting in each ALU 102, processing under the second circuit setting can be started. The rewrite signal that has been propagated through the plurality of ALUs 102 and output from the ALU 102 of the last stage is equivalent to a pulse signal that gives notice of the completion of every processing under the first circuit setting. Therefore, the configuration control unit 103 reads the rewrite signal output from the ALU 102 of the last stage, and sets values of the next circuit setting in the primary registers.

The advantageous effects of propagation of the foregoing rewrite signal are now described using FIGS. 3A, 3B, 4A, and 4B.

Figure 3A:
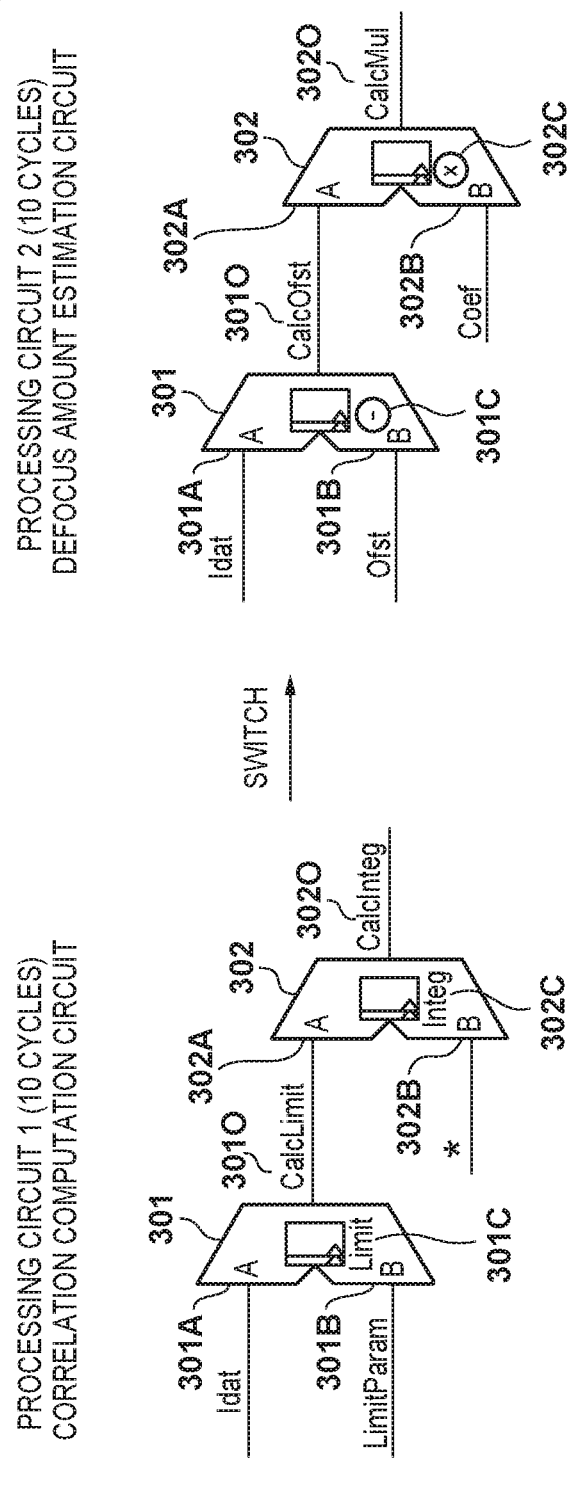
FIG. 3A is a diagram exemplarily showing conventional switching of a programmable circuit according to the first embodiment.
Figure 3B:
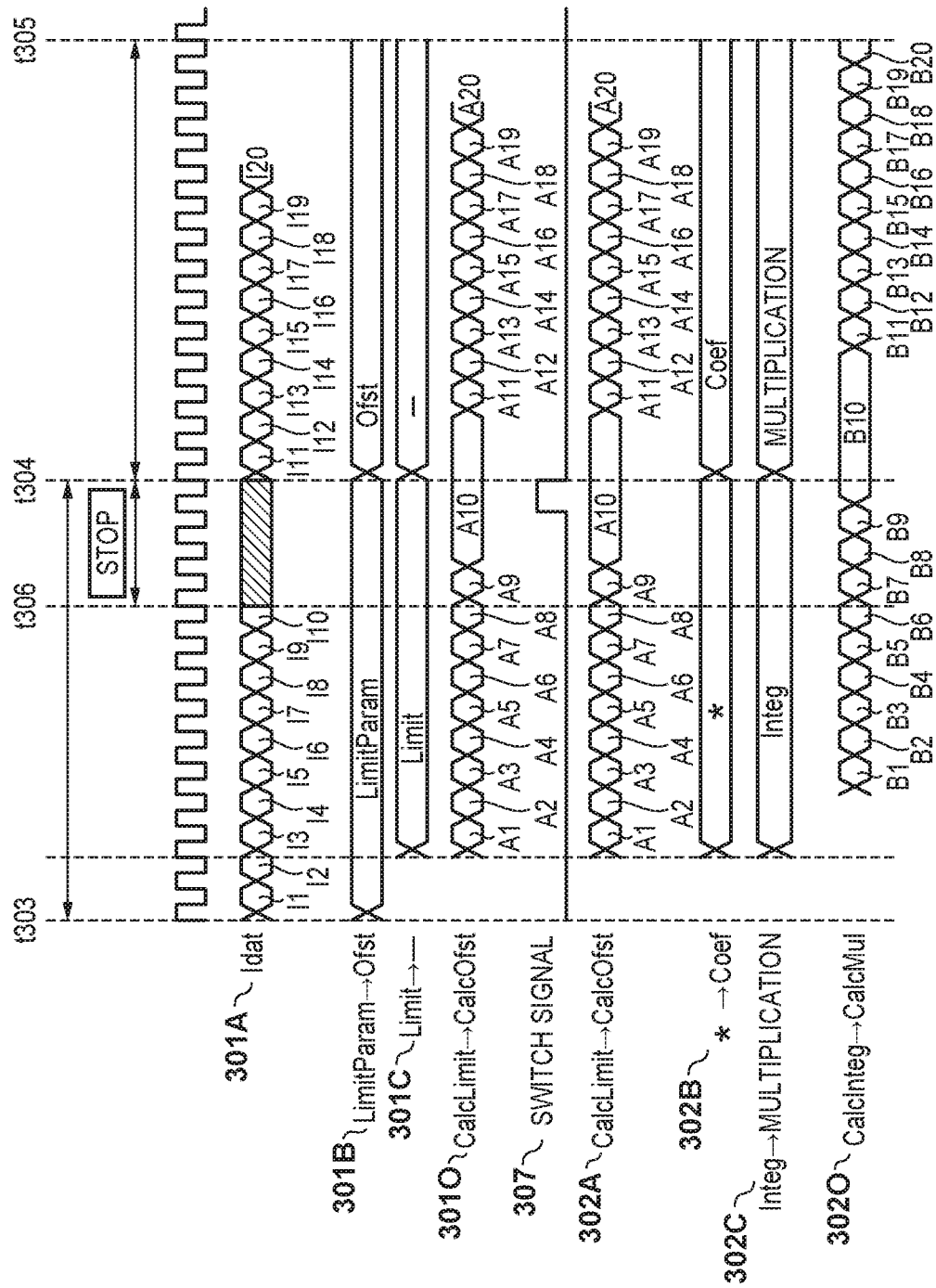
FIG. 3B is a timing chart of switching of FIG. 3A.
Figure 4B:
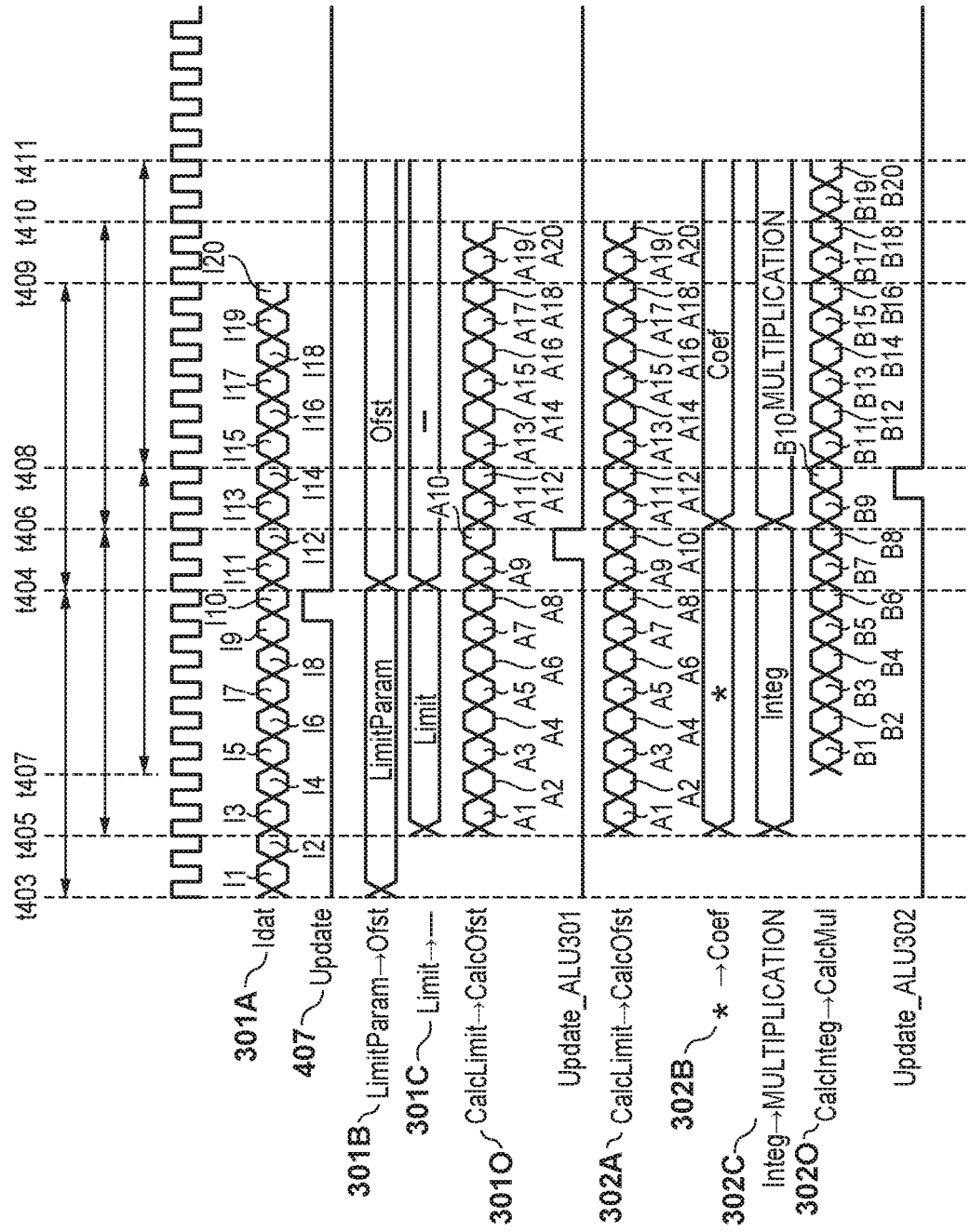
FIG. 4B is a timing chart of switching of FIG. 4A.

FIG. 4A is a diagram showing switching of processing circuits with the use of the rewrite signal 105, which is the concept of the present embodiment, and FIG. 4B is a timing chart thereof. On the other hand, FIGS. 3A and 3B are diagrams, for comparison with FIGS. 4A and 4B, showing switching of processing circuits in a conventional case where the rewrite signal is not used, and a timing chart thereof. As a processing circuit 1, for example, a part of an integration circuit for performing correlation computation is configured using an ALU 301 and an ALU 302. In the processing circuit 1, the ALU 301 is a limiter circuit for removing abnormal data, such as damaged data, when the correlation computation is performed. The ALU 302 is an integration circuit.

As a processing circuit 2, for example, a part of a conversion coefficient multiplication circuit for estimating defocus amounts is configured using the ALU 301 and the ALU 302. In the processing circuit 2, the ALU 301 is an offset adjustment circuit that precedes multiplication of a conversion coefficient. The ALU 302 is a multiplication circuit.

With respect to the ALU 301, an A-side input, a B-side input, the content of computation, and an output signal are represented as 301A, 301B, 301C, and 301O, respectively. With respect to the ALU 302, an A-side input, a B-side input, the content of computation, and an output signal are represented as 302A, 302B, 302C, and 302O, respectively. Also, it is assumed that each ALU has a delay amount of two steps. Each of the processing circuit 1 and the processing circuit 2 performs processing in ten cycles.

FIG. 3A shows configurations of the ALU 301 and the ALU 302 in the processing circuit 1 and the processing circuit 2 described above. FIG. 3B shows a timing chart of the processing circuit 1 and the processing circuit 2. A signal represented by "*" in the timing chart denotes don't care. A timing 303 represents a timing to start signal processing. A timing 306 is a timing to input the last data to be processed by the processing circuit 1. In FIG. 3B, as in the conventional case, all registers are switched at once. This makes it necessary to stop input data until all ALUs complete the computation of the processing circuit 1. In a period from the timing 306 to a timing 304 at which all ALUs complete the processing of the processing circuit 1 (indicated by oblique lines), input data is stopped. At the timing 304, a switch signal 307 is issued to all registers, thereby switching from the setting of the processing circuit 1 to the setting of the processing circuit 2. Thereafter, from the timing 304 to a timing 305, processing of the processing circuit 2 is executed.

In contrast, in FIGS. 4A and 4B, a rewrite signal generated by the timing control unit 104 is used in switching between circuit settings. In FIG. 4B, the rewrite signal is represented as Update 407. Update 407 is issued at a timing t404 of the last data of the processing circuit 1, and is propagated through each ALU in synchronization with input data Idat. Therefore, the rewrite signal arrives at the ALU 301 at the timing t404 at which every processing of the ALU 301 in the processing circuit 1 is completed. At the timing t404, the ALU 301 is updated to the processing circuit 2, and executes processing of the processing circuit 2 until a timing t410.

On the other hand, a timing at which the rewrite signal arrives at the ALU 302, which is positioned in the subsequent stage, is a timing t406 at which every processing of the ALU 302 in the processing circuit 2 is completed. At the timing t406, the ALU 302 is updated to the processing circuit 2, and executes processing of the processing circuit 2 until a timing 1411.

With respect to the input signal Idat, the ALU 302 is delayed by two units of delay in the ALU 301. Therefore, the timing of completion of every processing in the processing circuit 1 differs between the ALU 301 and the ALU 302. At this time, by propagating the rewrite signal Update 407 for the processing circuits, each ALU is updated to the processing circuit 2 at a timing at which each ALU completes the processing circuit 1. This eliminates the need for a stop period for switching between the processing circuits, thereby making it possible to improve throughput.

As described above, according to the present embodiment, the rewrite signal is propagated in synchronization with a data signal, thereby making it possible to provide a signal processing apparatus that can rewrite circuit information in a pipeline and improve throughput of a programmable circuit.

Also, it is desirable that the input-selection unit 901 of the ALU 102 (see FIG. 9) set initial values of the input signal selection registers 906a, 906b so that a signal to which the rewrite signal is appended is selected. In the present embodiment, the rewrite signal is appended to input data, and is not appended to all signals. Therefore, in the present embodiment, by setting a signal to which the rewrite signal is appended, such as input data, as an initial value, the rewrite signal can be passed to all ALUs 102.

Figure 11:
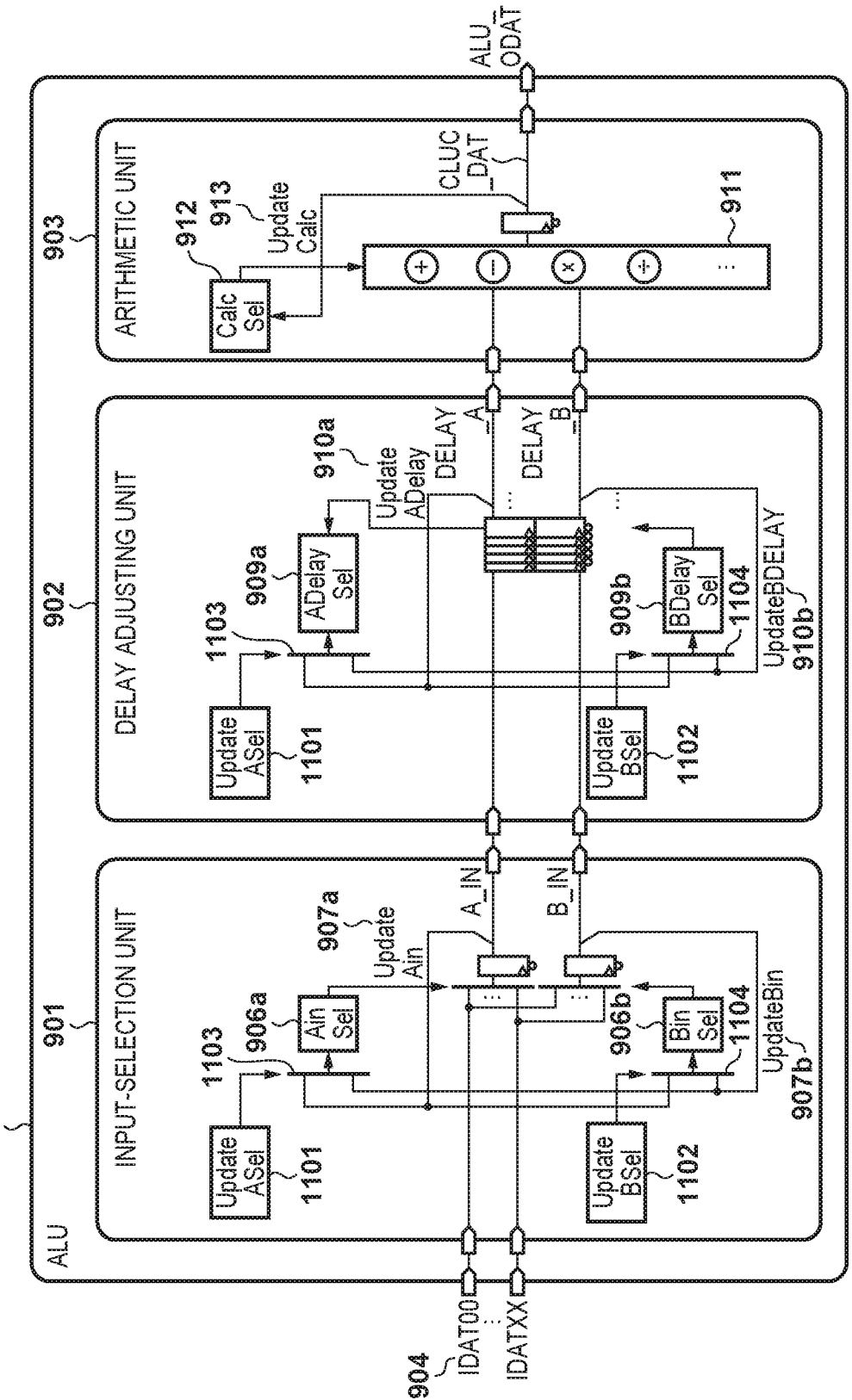
FIG. 11 is a block diagram showing a configuration of an ALU according to the first embodiment.

Furthermore, it is permissible to adopt a configuration in which, at a timing at which the plurality of input data selection registers existing in the ALU 102 update setting values, the rewrite signal appended to another input signal is selectable. For example, in FIG. 9, when a signal to which the rewrite signal is not appended, such as a parameter, has been selected as the B-side input signal, the rewrite signal does not arrive as a B-side signal, and thus the input data selection registers 906b and 909b cannot be rewritten. In view of this, the rewrite signal appended to another input signal may be referred to as in FIG. 11. In FIG. 11, an A-side rewrite signal selector 1103, an A-side rewrite signal selection register 1101, a B-side rewrite signal selector 1104, and a B-side rewrite signal selection register 1102 are included, as opposed to FIG. 9. This enables the input data selection registers 906a, 906b, 909a, 909b to refer to the rewrite signal appended to an arbitrary input signal.

Although a connection relationship between two ALUs has been described in the foregoing embodiment, the same is applicable also to a case where three or more ALUs are connected. Also in a case where three or more ALUs are connected consecutively, with respect to two neighboring ALUs, namely an ALU on the upstream side and an ALU on the downstream side, the update may be performed in such a manner that an update timing of the ALU on the upstream side is accelerated by the number of cycles pertaining to processing of the ALU on the downstream side.

Second Embodiment

Next, a second embodiment of the present invention is described. Although the first embodiment has been described above using an exemplary case where the processing circuit 1 and the processing circuit 2 have the same delay amount, the respective circuits may have different delay amounts. At this time, the data-flow control unit 108 performs control so that input data is stopped for a duration of a difference between the delay amounts of the processing circuit 1 and the processing circuit 2.

The following describes the operations of a signal processing circuit 100 according to the present embodiment with reference to FIGS. 5A, 5B, 6A, and 6B.

Figure 6A:
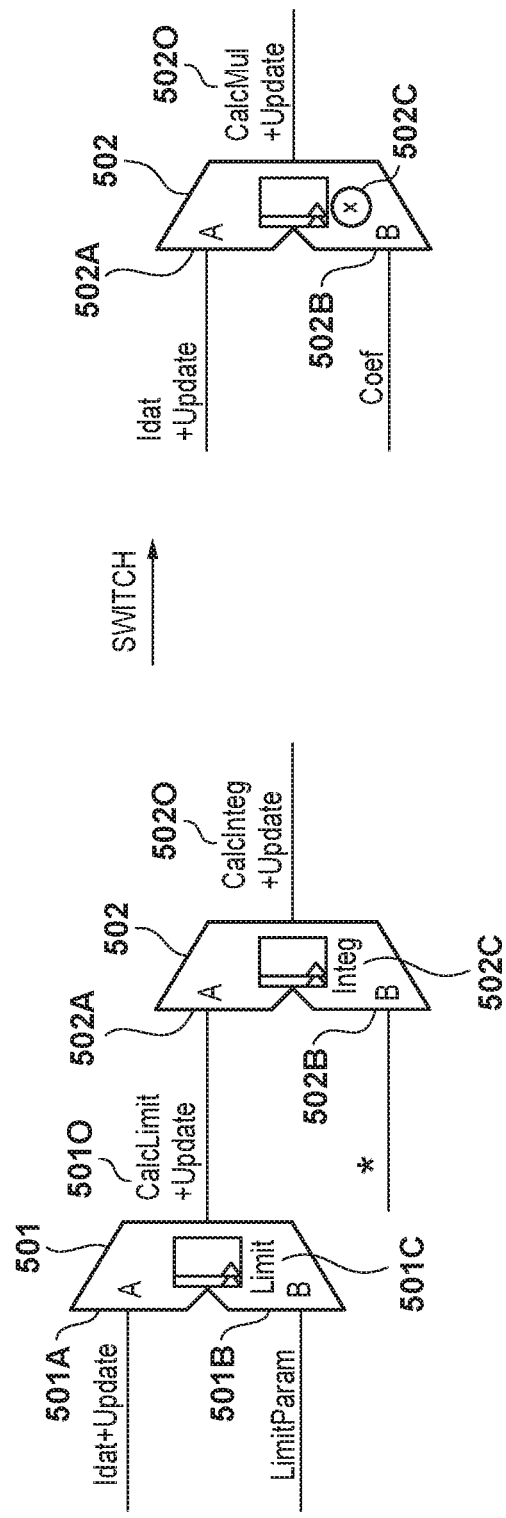
FIG. 6A is a diagram exemplarily showing switching of a programmable circuit according to a second embodiment.

FIG. 6A is a diagram showing switching between processing circuits in a case where input data is stopped using the data-flow control unit 108, and FIG. 6B is a timing chart thereof. FIGS. 5A and 5B show switching between processing circuits in a conventional case where input data is not stopped and a timing chart thereof, for comparison with FIGS. 6A and 6B. Regarding a processing circuit 1, similarly to the first embodiment, a part of an integration circuit for performing correlation computation is configured using an ALU 501 and an ALU 502. Regarding a processing circuit 2, although a part of a conversion coefficient multiplication circuit for estimating defocus amounts is configured similarly to the first embodiment, an offset adjustment circuit that precedes multiplication of a conversion coefficient is absent, and only a multiplication circuit is provided.

In FIG. 5A, with respect to the ALU 501, an A-side input, a B-side input, the content of computation, and an output signal are represented as 501A, 501B, 501C, and 501O, respectively. With respect to the ALU 502, an A-side input, a B-side input, the content of computation, and an output signal are represented as 502A, 502B, 502C, and 502O, respectively.

FIG. 5A shows configurations of the ALU 501 and the ALU 502 in the respective processing circuit 1 and processing circuit 2 described above. FIG. 5B shows a timing chart of the processing circuit 1 and the processing circuit 2.

In FIG. 5A, the output signal of the ALU 501 is selected as the A-side input signal 502A of the ALU 502 of the processing circuit 1. The ALU 502 of the processing circuit 2 selects input data Idat. Therefore, a delay amount decreases at the time of change from the processing circuit 1 to the processing circuit 2, leading to the occurrence of overtaking of data. Specifically, two pieces of data between timings t506 and t508 in FIG. 5B are lost due to the occurrence of overtaking of data. As a result, all pieces of data in the processing circuit 2 cannot be processed correctly.

In contrast, in FIGS. 6A and 6B, an operation to stop input data is performed using the data-flow control unit 108 when switching between circuit settings. In FIG. 6B, input data is stopped at a timing t604 at which input of all pieces of input data of the processing circuit 1 is completed. Two cycles representing a difference between a delay amount of the processing circuit 1 and a delay amount of the processing circuit 2 is set as the number of cycles to be stopped. This enables the ALU 502 to perform processing correctly with respect to all pieces of data in the processing circuits.

As described above, according to the present second embodiment, if a delay amount of a circuit for the next processing is smaller than a delay amount of a circuit that is currently performing processing when switching between circuit settings, input data is stopped to prevent overtaking of data this makes it possible to prevent loss of data and perform desired processing.

Figure 7:
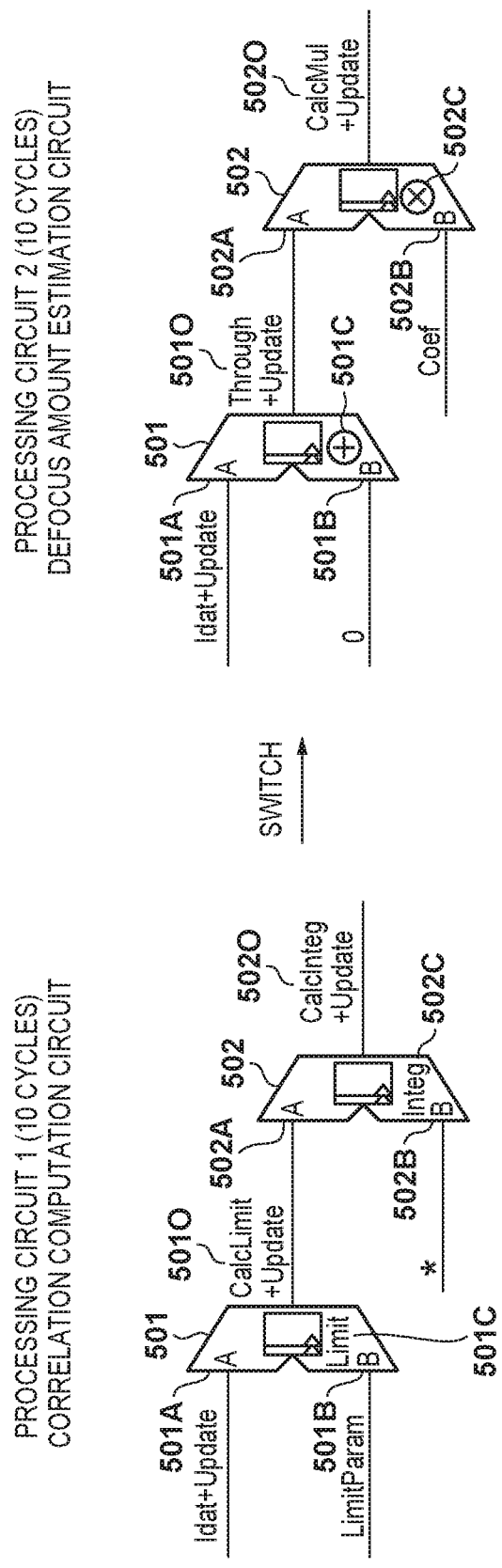
FIG. 7 is a block diagram showing a configuration and switching of the programmable circuit according to the second embodiment.

Furthermore, the occurrence of a stop period can be suppressed by inserting a delay adjustment circuit as means for preventing the foregoing overtaking of data. FIG. 7 shows a circuit in which a delay adjustment circuit that prevents overtaking of data is inserted. The difference from FIG. 6A is that the processing circuit 2 includes the ALU 501 as the delay adjustment circuit. The delay adjustment circuit can have a desired delay amount by setting the delay adjusting unit 902 inside the ALU 102 (see FIG. 9). Furthermore, as shown in FIG. 7, adding a value 0 realizes the delay adjustment circuit that merely delays input data. By inserting such a delay adjustment circuit in the processing circuit 2, the delay amounts become equal, the occurrence of the stop period is suppressed, and throughput can be improved.

Third Embodiment

Next, a third embodiment of the present invention is described. While the second embodiment has been described using an exemplary case where the delay amount of the processing circuit 2 is smaller than the delay amount of the processing circuit 1, the following describes a case where the delay amount of the processing circuit 2 is larger than the delay amount of the processing circuit 1. At this time, the data-flow control unit 108 controls a control signal valid for determining whether data is valid or invalid so as to treat excess data that is generated in correspondence with a difference between the delay amounts of the processing circuit 1 and the processing circuit 2 as invalid data.

Figure 8A:
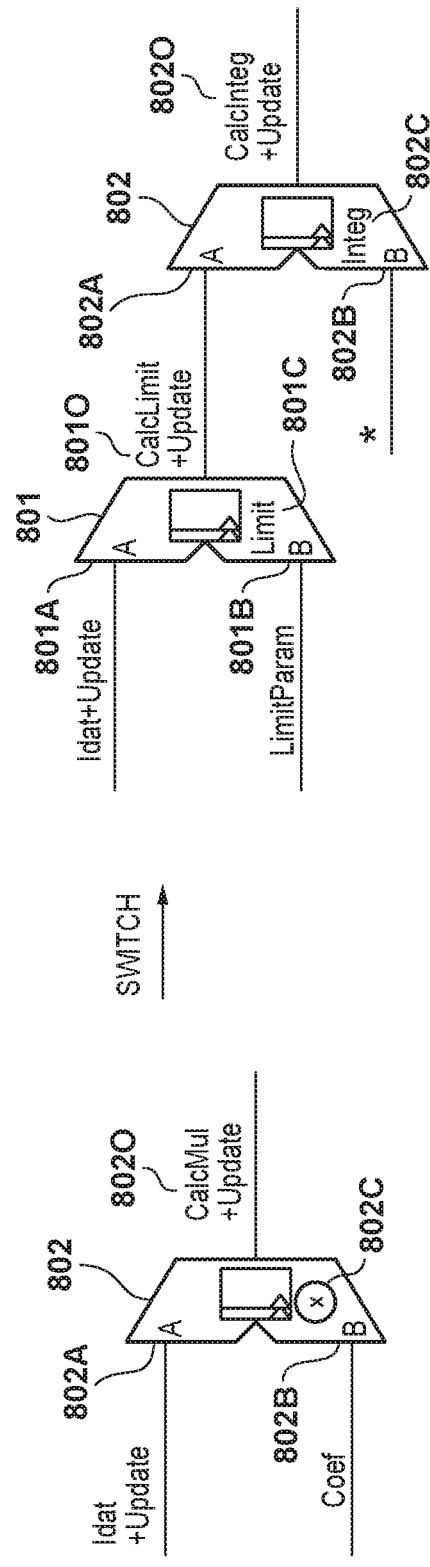
FIG. 8A is a diagram exemplarily showing switching of a programmable circuit according to a third embodiment.
Figure 8B:
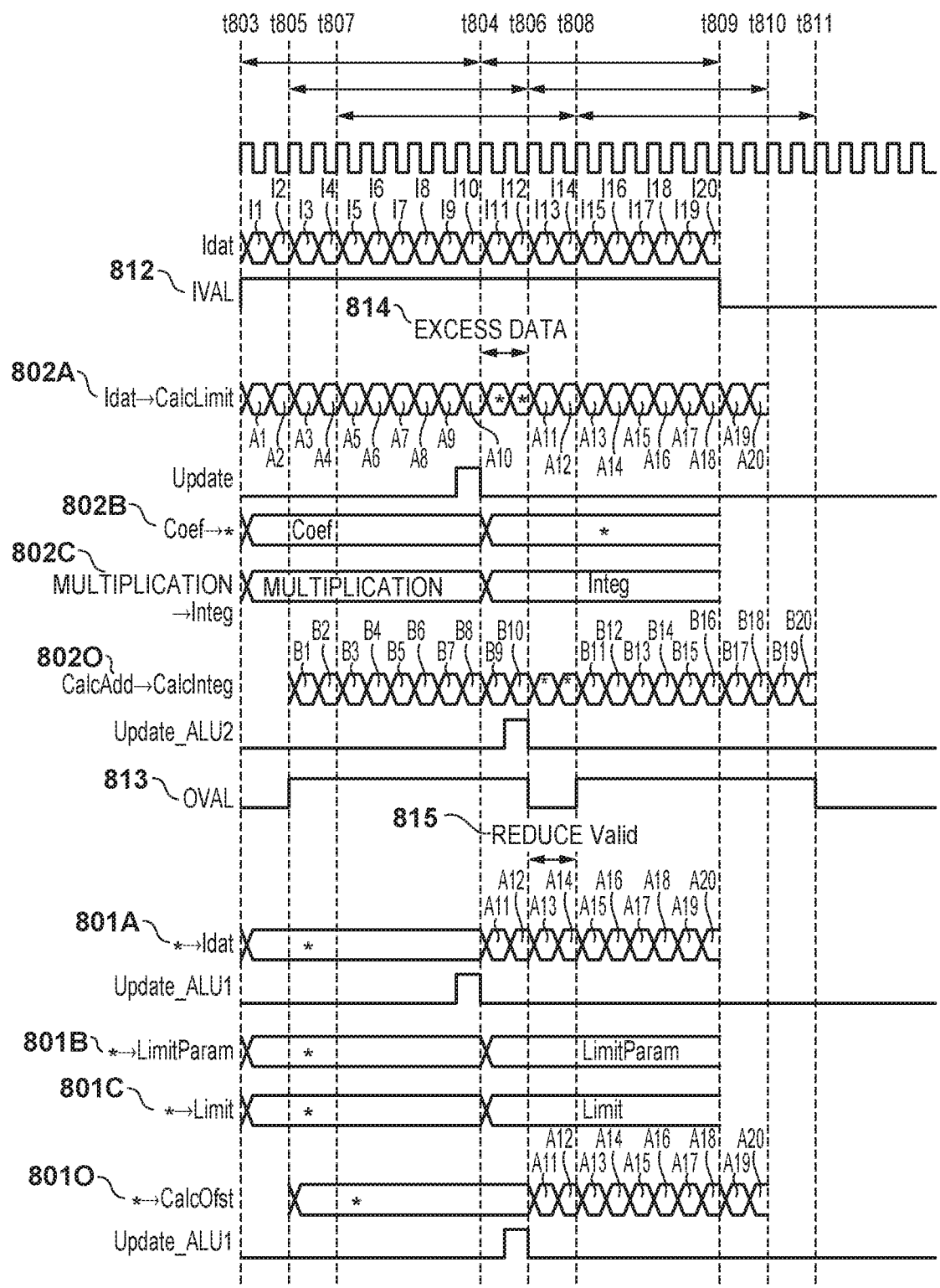
FIG. 8B is a timing chart of switching of FIG. 8A.

The following describes the operations of a signal processing circuit 100 according to the present embodiment with reference to FIGS. 8A and 8B.

In FIG. 8A, with respect to an ALU 802, an A-side input, a B-side input, the content of computation, and an output signal are represented as 802A, 802B, 802C, and 802O, respectively. Also, with respect to an ALU 801, an A-side input, a B-side input, the content of computation, and an output signal are represented as 801A, 801B. 801C, and 801, respectively.

FIG. 8B is a timing chart of control over a control signal valid using the data-flow control unit 108. A control signal for determining whether input data is valid or invalid is represented as IVAL 812, and a control signal for notifying a circuit of a stage subsequent to signal processing 100 of whether output data output from the programmable circuit 101 (reference numeral 8020 in FIG. 8A) is valid or invalid is represented as OVAL 813. In FIG. 8A, input data Idat is selected as the A-side input signal of the ALU 802 of the processing circuit 1. The ALU 802 of the processing circuit 2 selects an output signal of the ALU 801. Therefore, a delay amount increases at the time of change from the processing circuit 1 to the processing circuit 2, and excess data 814 is generated in a period between timings t804 and t806. As this data is invalid data, it is necessary to notify the circuit of the subsequent stage of invalidity of the data. In view of this, OVAL 813 is controlled to be Low at a timing of output of the invalid data (the last output timing of the processing circuit 1), thereby making it possible to notify the circuit of the subsequent stage of invalidity of the data.

As described above, according to the present embodiment, if a delay amount of a circuit for the next processing is larger than a delay amount of a circuit that is currently performing processing when switching between circuit settings, a control signal is controlled so as to give notice of output of invalid data this makes it possible to perform desired processing.

Although preferred embodiments of the present invention have been described above, the present invention is not limited to these embodiments, and various modifications and changes are possible within the scope of the essential spirit of the present invention.

Fourth Embodiment

The following describes a fourth embodiment. It is assumed that an apparatus configuration according to the present embodiment is the same as that of FIG. 1, and a description of this configuration is omitted.

A description is now given of the number of rewrite signals 105 issued by the timing control unit 104 with reference to FIG. 13. The timing control unit 104 includes a plurality of pulse generators. FIG. 13 shows the timing control unit 104 including nine pulse generators 1321 to 1329 corresponding to nine ALUs 1301 to 1307. Each pulse generator is composed of a counter and a comparator. The pulse generators 1321 to 1329 issue write signals 1311 to 1319 (these are encompassed within the rewrite signal 105 of FIG. 1) to the ALUs 1301 to 1307. A start timing for counting can be set individually in the counter included in each pulse generator. In the first circuit setting, the start timing is delayed by a delay amount that is required for data to be processed to arrive at a corresponding ALU. For example, the start timing is delayed by two cycles in the counter of the pulse generator 1322 corresponding to the ALU 1302, and by four cycles in the counter of the pulse generator 1323 corresponding to the ALU 1303. For example, provided that processing is performed in 10 cycles under the first circuit setting, the rewrite signal 1312 to the ALU 1302 is issued 12 cycles after the start of processing under the first circuit setting. Also, the rewrite signal 1313 to the ALU 1303 is issued 14 cycles after the start of processing under the first circuit setting. By thus setting an individual rewrite timing in each ALU, processing under the second circuit setting can be started in a cycle next to the completion of processing under the first circuit setting in each ALU.

Furthermore, it is permissible to adopt a mode in which the timing control unit 104 includes one counter and a plurality of comparators, and issues a rewrite signal 105 when a predetermined count value is achieved. In this case, the counter needs to perform additional counting in correspondence with an arithmetic delay of each ALU.

Note that it is not necessarily required to provide a plurality of counters, and rewrite signals 105 corresponding to the delay amounts of the respective ALUs can be issued by offsetting a delay amount with respect to one counter. Also, the number of counters may be reduced by setting a timing of issuance of a rewrite signal 105 in accordance with the number of ALUs.

When it is not desired to perform additional counting under each circuit setting, as in a horizontal counter in image processing, as a predetermined count value under the first circuit setting is delayed by an arithmetic delay of each ALU, the count value is set to be carried over to the second circuit setting.

Furthermore, a rewrite signal 105 is issued once before the programmable circuit unit 101 starts signal processing with respect to input data. As the double-buffer configuration is used, it is necessary to cause the secondary registers existing within the ALUs 102 to update the first circuit setting before the signal processing is started. Therefore, circuit information is set in the primary registers, and the issuance is made once before the signal processing is started with respect to input data; as a result, the secondary registers update setting values.

The advantageous effects of providing the foregoing plurality of rewrite signals 105 are now described using FIGS. 3A, 3B, 12A, and 12B.

Figure 12A:
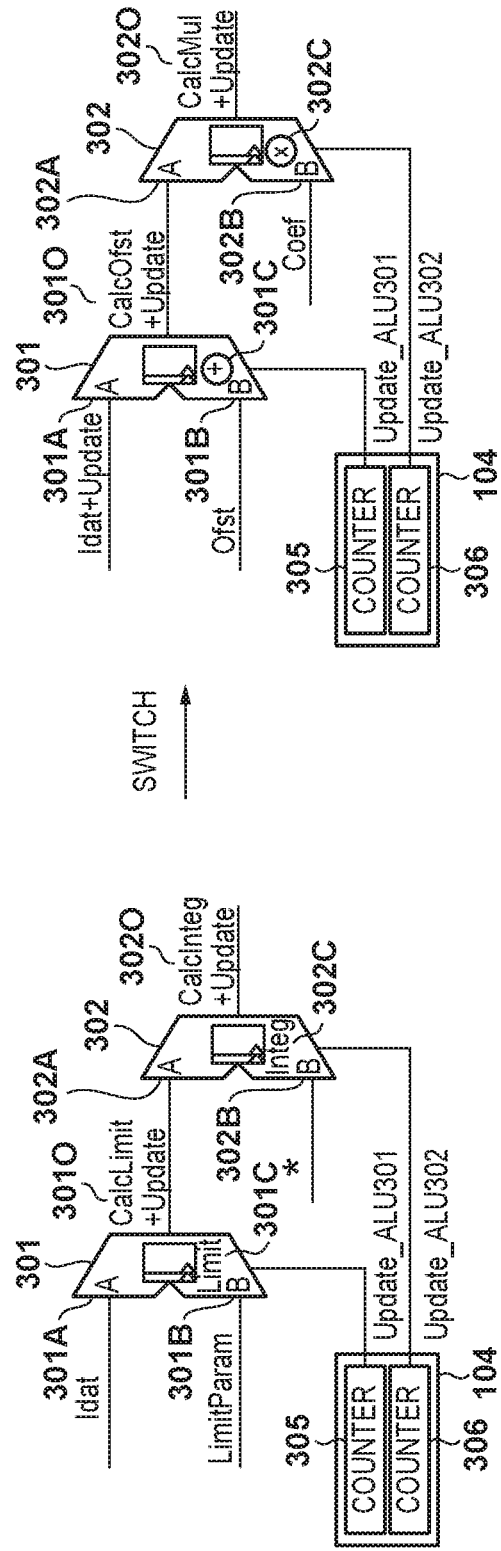
FIG. 12A is a diagram exemplarily showing switching of a programmable circuit according to a fourth embodiment.

Regarding a processing circuit 1 in FIG. 3A and FIG. 12A, for example, a part of an integration circuit for performing correlation computation is configured using an ALU 301 and an ALU 302. In the processing circuit 1, the ALU 301 is a limiter circuit for removing abnormal data, such as damaged data, when the correlation computation is performed. The ALU 302 is an integration circuit.

Also, regarding a processing circuit 2 in FIG. 12A, for example, a part of a conversion coefficient multiplication circuit for estimating defocus amounts is configured using the ALU 301 and the ALU 302. In the processing circuit 2, the ALU 301 is an offset adjustment circuit that precedes multiplication of a conversion coefficient. The ALU 302 is a multiplication circuit.

With respect to the ALU 301, an A-side input, a B-side input, the content of computation, and an output signal are represented as 301A, 301B, 301C, and 301O, respectively. With respect to the ALU 302, an A-side input, a B-side input, the content of computation, and an output signal are represented as 302A, 302B, 302C, and 302O, respectively. Also, it is assumed that each ALU has a delay amount of two steps. Each of the processing circuit 1 and the processing circuit 2 performs processing in ten cycles.

FIG. 3A shows configurations of the ALU 301 and the ALU 302 in the processing circuit 1 and the processing circuit 2 described above. FIG. 3B shows a timing chart of the processing circuit 1 and the processing circuit 2. A signal represented by * in the timing chart denotes don't care. A timing 1303 represents a timing to start signal processing. A timing 1306 is an input timing of the last data to be processed by the processing circuit 1. In FIGS. 3A and 3B, as in the conventional case, all registers are switched at once. This makes it necessary to stop input data until all ALUs complete the computation of the processing circuit 1. In a period from the timing 306 to the timing 304 at which all ALUs complete the processing of the processing circuit 1 (indicated by oblique lines), input data is stopped. At the timing 304, a switch signal 307 is issued to all registers, thereby switching from the setting of the processing circuit 1 to the setting of the processing circuit 2. Thereafter, from the timing 1304 to the timing 1305, processing of the processing circuit 2 is executed.

Figure 12B:
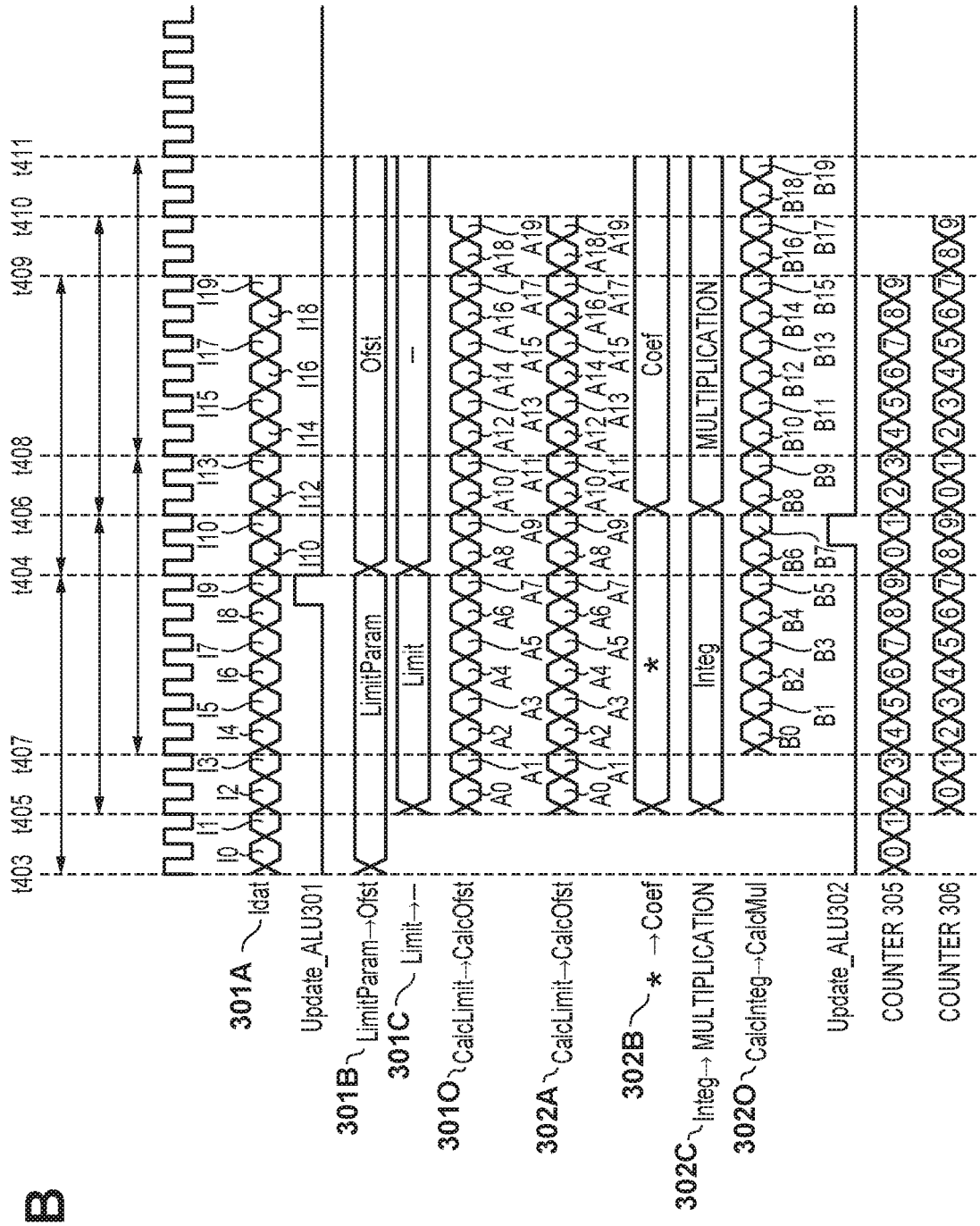
FIG. 12B is a timing chart of switching of FIG. 12A.

In contrast, in FIGS. 12A and 12B, rewrite signals 105 generated by the timing control unit 104 are used in switching between circuit settings. In FIG. 12A, a rewrite signal used by the ALU 301 is represented as Update_ALU301 and issued by a counter 305. A rewrite signal used by the ALU 302 is represented as Update_ALU302. Update_ALU301 is issued by a counter 306 at the timing t404 of the last data of the processing circuit 1 in the ALU 301 (a timing at which the counter 305 has counted ten cycles). As shown in FIG. 9, the data storage units that hold the settings within the ALU 301 are each updated after a delay therein. At the timing 406, the data storage units that hold all of the settings within the ALU 301 are updated to the processing circuit 2, and the processing of the processing circuit 2 is executed until the timing t410. With respect to the input signal Idat, the ALU 302 is delayed by two units of delay in the ALU 301. Therefore, the timing of completion of every processing in the processing circuit 1 differs between the ALU 301 and the ALU 302. At this time, the counter 306 issues Update_ALU302 to the ALU 302 at the timing t406 at which 12 cycles have been counted. Also, the counter 306 may start counting from a timing t405 that coincides with the elapse of a delay corresponding to two cycles since the start of the processing under the first circuit setting, and issue Update_ALU302 at the timing t406 at which ten cycles have been counted. Similarly to the ALU 301, the data storage units that hold the settings within the ALU 302 are each updated after a delay therein. At a timing t408, the data storage units that hold all of the settings within the ALU 302 are updated to the processing circuit 2, and the processing of the processing circuit 2 is executed until the timing t411. This eliminates the need for a stop period for switching between the processing circuits, thereby making it possible to improve throughput.

As described above, according to the present fourth embodiment, rewrite signals 105 are propagated in synchronization with a data signal, thereby making it possible to provide a signal processing apparatus that can rewrite circuit information in a pipeline and improve throughput of a programmable circuit.

Although the primary registers and the secondary registers are configured using shift registers in the present embodiment, no limitation is intended in this regard. For example, the foregoing two types of registers may be configured as banking registers. In this case, the present embodiment can be applied while using registers that are not currently used, which are determined based on the issuance of rewrite signals 105, as primary registers.

Fifth Embodiment

A description is now given of a fifth embodiment of the present invention. Although the fourth embodiment has been described above under the assumption that the timing control unit issues one rewrite signal 105 per ALU, one rewrite signal 105 may be issued per group of an arbitrary number of ALUs. The present fifth embodiment differs from the fourth embodiment in that the rewrite signal 105 is issued for each group of ALUs at which data to be processed arrives with the same delay amount. It is assumed that an apparatus configuration according to the present fifth embodiment is the same as that of FIG. 1 according to the first embodiment, and a description of this configuration is omitted.

Figure 14:
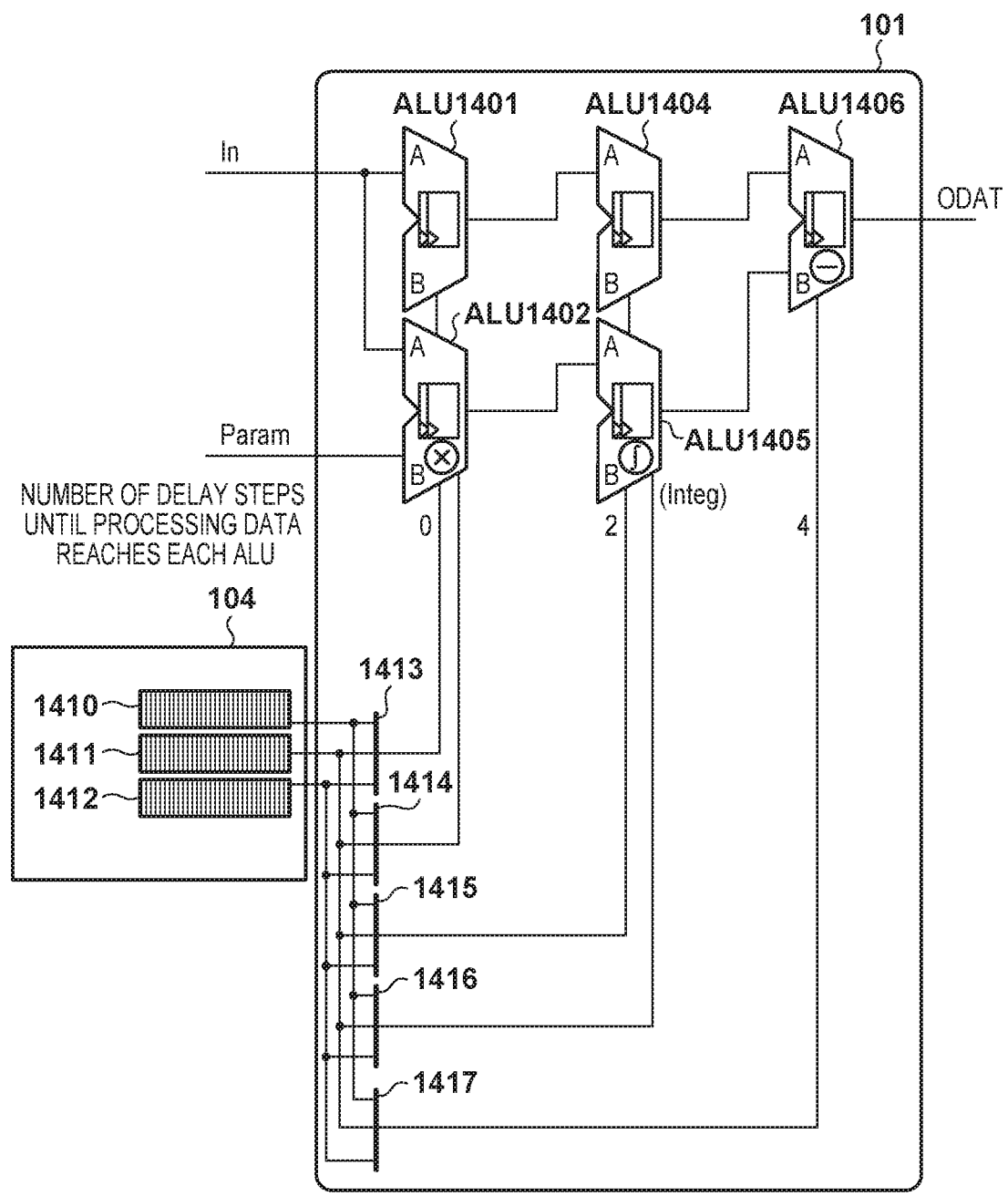
FIG. 14 is a diagram showing structures of a timing control unit and a programmable circuit according to a fifth embodiment.

FIG. 14 is a diagram that shows configurations of the timing control unit 104 and the programmable circuit 101 according to the present fifth embodiment, and particularly shows a correspondence relationship between the number of rewrite signals 105 issued by the timing control unit 104 and ALUs. The ALUs respectively have rewrite signal selection units 1413 to 1417 that select pulse generators 1410 to 1412 inside the timing control unit 104. FIG. 14 shows an example in which clamp calculation is performed. A correction value is obtained by performing multiplication using a cyclic coefficient Param in the ALU 1402 and performing integration in the ALU 1405. Thereafter, the ALU 1406 subtracts the obtained correction value from input data. The ALU 1401 and the ALU 1404 operate as delay elements for equalizing delays.

At this time, it is assumed that data to be processed arrives at the ALU 1401 and the ALU 1402, which are in a parallel relationship, with the same delay amount. As the two ALUs 1401, 1402 can complete processing and start processing under the next circuit setting at the same timing, it is sufficient that the same rewrite signal 105 be needed for the ALU 1401 and the ALU 1402. In view of this, the rewrite signal selection units 1413, 1414 are controlled so that the ALU 1401 and the ALU 1402 refer to the rewrite signal 105 issued by the same pulse generator/counter 1410. Similarly, data to be processed also arrives at the ALU 1404 and the ALU 1405 with the same delay amount. Therefore, the rewrite signal selection units 1415, 1416 are controlled so that the rewrite signal 105 issued by the same pulse generator/counter 1411 is referred to. The rewrite signal selection unit 1417 is controlled so that the ALU 1406 refers to another pulse generator/counter 1412. As a result of the foregoing, three pulse generators/counters are necessary as shown in the figure.

Note that when a delay amount differs between the ALU 1401 and the ALU 1402, which are in a parallel relationship, it is sufficient to use an update timing of one of these two ALUs with a larger delay amount in these two ALUs.

As described above, each group of ALUs at which data to be processed arrives with the same delay amount refers to the rewrite signal 105 issued by the same pulse generator/counter; as a result, the number of pulse generators/counters can be lowered, and the circuit size can be reduced.

Furthermore, it is permissible to provide a rewrite signal selection unit for each group of ALUs in a specific region. This can reduce the number of rewrite signal selection units.

Sixth Embodiment

Figure 15:
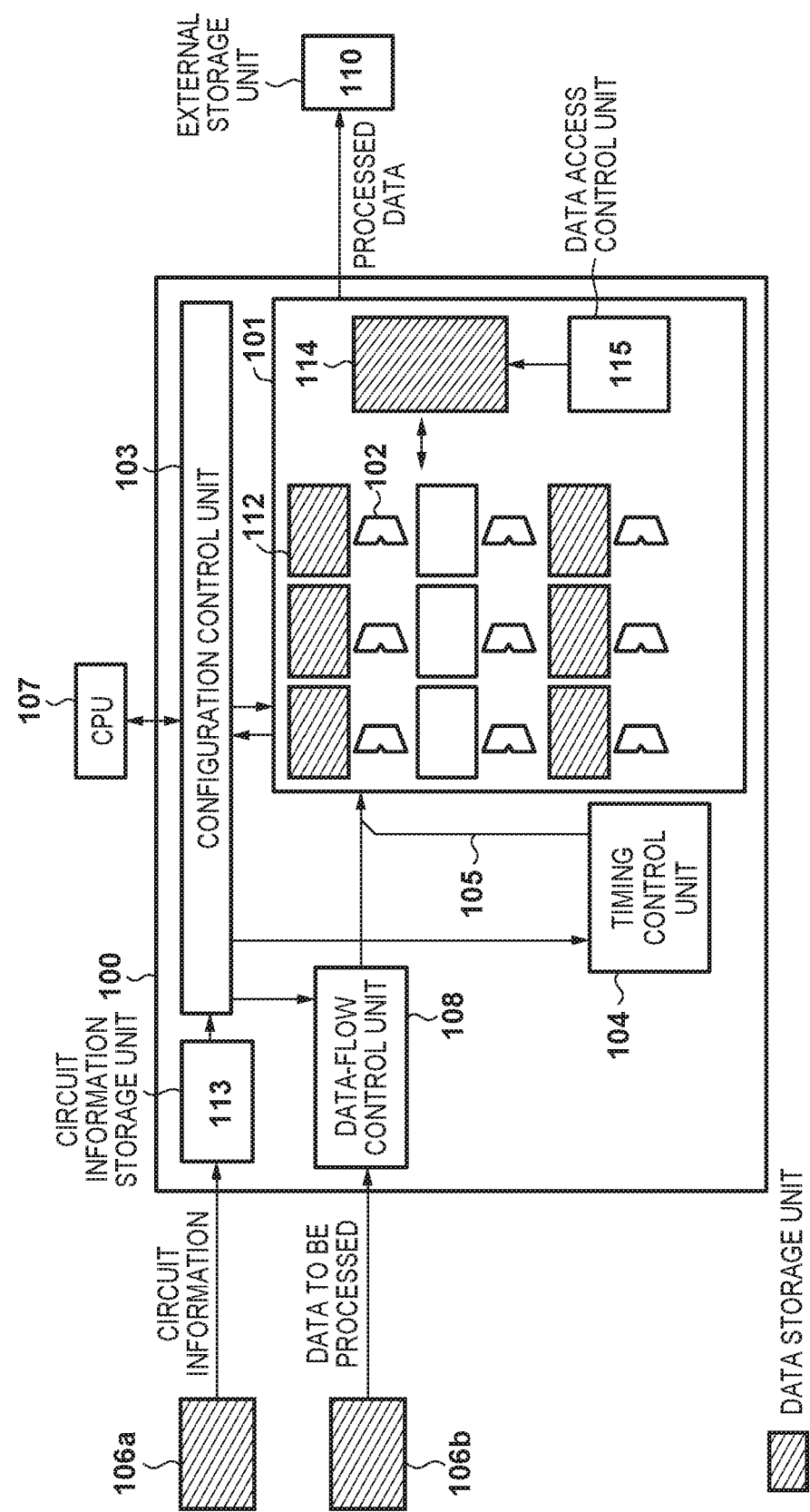
FIG. 15 is a block diagram showing a signal processing apparatus according to a sixth embodiment.

The following describes a sixth embodiment. FIG. 15 is a block configuration diagram of an information processing apparatus according to the present fifth embodiment. The difference from the constituents according to the first embodiment is that a data storage unit 114 and a data access control unit 115 are added to the programmable circuit 101; as other constituents are the same as those of FIG. 1, a description of constituents other than the data storage unit 114 and the data access control unit 115 is omitted. It is also assumed that the internal structure of the ALU 102 is similar to that of FIG. 9.

The data storage unit 114 inside the programmable circuit 101 is temporary storage means for storing the computation results used in the signal processing apparatus 100, correction values used in computation, and the like, and is composed of, for example, an SRAM. The data access control unit 115 is a control unit that outputs a control signal for controlling access to the data storage unit 114. This data access control unit 115 outputs an address signal, a chip select signal, and a request signal that permits reading/writing of data to the data storage unit 114 based on configuration information transferred from the configuration control unit 103.

Note that similarly to the fourth and fifth embodiments described above, the timing control unit 104 according to the present sixth embodiment generates a pulsed rewrite signal 105 at an arbitrary timing and transfers the same to the plurality of ALUs 102 under control of the configuration control unit 103. The rewrite signal 105 is a load signal that gives notice of a timing to update configuration information of the plurality of ALUs 102. Regarding a timing to generate the rewrite signal 105, it is desirable to issue the same at a timing at which each of the plurality of ALUs 102 processes the last data, or at a timing at which it processes the first data to which the next circuit setting is applied. In this way, configuration information can be updated after each ALU 102 has completed processing corresponding to a desired number of data pieces.

<Example of Processing of Programmable Circuit>

With reference to FIG. 2 again, the present sixth embodiment is described using an example in which the programmable circuit is used in implementing a part of a processing flow from the obtainment of defocus amounts to the formation of a distance map based on a pupil division method that uses divided pixels on an image sensor, similarly to the first embodiment. Known techniques may be used with respect to the configuration of the image sensor having divided pixels and the method of obtaining a distance map corresponding to parallax images.

In step S200, luminance values (hereinafter referred to as Y values) are obtained from an A image signal. In step S201, Y values are obtained from a B image signal. Then, in step S202, correlation of parallax differences is computed from the Y values obtained in steps S200 and S201. In step S203, defocus amounts are estimated from an amount of relative image shift due to the parallax differences, which has been obtained through the correlation computation of step S202. Then, in step S204, unevenness in the defocus amounts on a plane caused by lens aberration is corrected.

In the present sixth embodiment, in order to switch the ALU configuration within the programmable circuit unit 101 in each of the foregoing steps S200 to S204, pieces of circuit information 200 to 204 are set for steps S200 to S204, respectively. The pieces of circuit information 200 to 204 are stored into the data storage unit 106a of FIG. 1 in advance. When the programmable circuit unit 101 is initialized, the pieces of circuit information 200 to 204 are transferred to the circuit information storage unit 113.

The configuration control unit 103 decodes the circuit information 200, and passes setting values of a plurality of registers, such as the input data selection registers 906a, 906b of FIG. 9, to each ALU 102. Registers pertaining to a circuit configuration of the programmable circuit unit 101 have a double-buffer configuration of a primary register, such as the data storage units 112, and a secondary register, such as the input data selection registers 906a, 906b. The configuration control unit 103 transfers the values that have been passed to the primary registers based on the circuit information 200 to the secondary registers installed in each ALU 102. Then, after the transfer is completed, the configuration control unit 103 requests the circuit information storage unit 113 to transfer the circuit information 201 in order to update the primary registers to the next circuit information.

A timing at which the secondary registers existing within each ALU 102 update a setting value is a timing at which a rewrite signal, which is propagated in synchronization with an output signal of a selector that has been set in each setting register, arrives at each setting register. The rewrite signal is generated by the timing control unit 104 at an arbitrary timing, and is propagated in synchronization with an input signal of the programmable circuit unit 101. In this way, in a cycle next to the completion of processing under the first circuit setting in each ALU 102, processing under the second circuit setting can be started. The rewrite signal that has been propagated through the plurality of ALUs 102 and output from the ALU 102 of the last stage is equivalent to a pulse signal that gives notice of the completion of every processing under the first circuit setting. Therefore, the configuration control unit 103 reads the rewrite signal output from the ALU 102 of the last stage, and sets values of the next circuit setting in the primary registers.

The advantageous effects of propagation of the foregoing rewrite signal have already been described with reference to FIGS. 3A, 3B, 4A, and 4B according to the first embodiment.

When the rewrite signal 105 is propagated in synchronization with input data, the rewrite signal is propagated to an ALU 102 that has selected the input data. Alternatively, the rewrite signal is propagated to another ALU 102 that has referred to an output from the ALU 102 that has selected the input data. However, as readout data of the data storage unit 114, which is the SRAM and the like, is not necessarily synchronized with input data of the reconfigurable circuit unit 101; this does not cause propagation of the rewrite signal 105. For example, assume a case where the processing circuit 1 of FIGS. 4A and 4B generates a lookup table of 0 to 4095, and the processing circuit 2 performs processing with reference to the generated lookup table. While the rewrite signal 105 is stored in synchronization with the value 4095, which is the last data in the lookup table, a timing at which the processing circuit 2 refers to the value 4095 does not necessarily correspond to the last data in the processing circuit 2.

To solve this problem, in the present sixth embodiment, the rewrite signal 105 is propagated in synchronization with a control signal for controlling the data storage unit 114, and the data storage unit 114 causes the rewrite signal 105 to be propagated in synchronization with data to be read out.

Figure 16A:
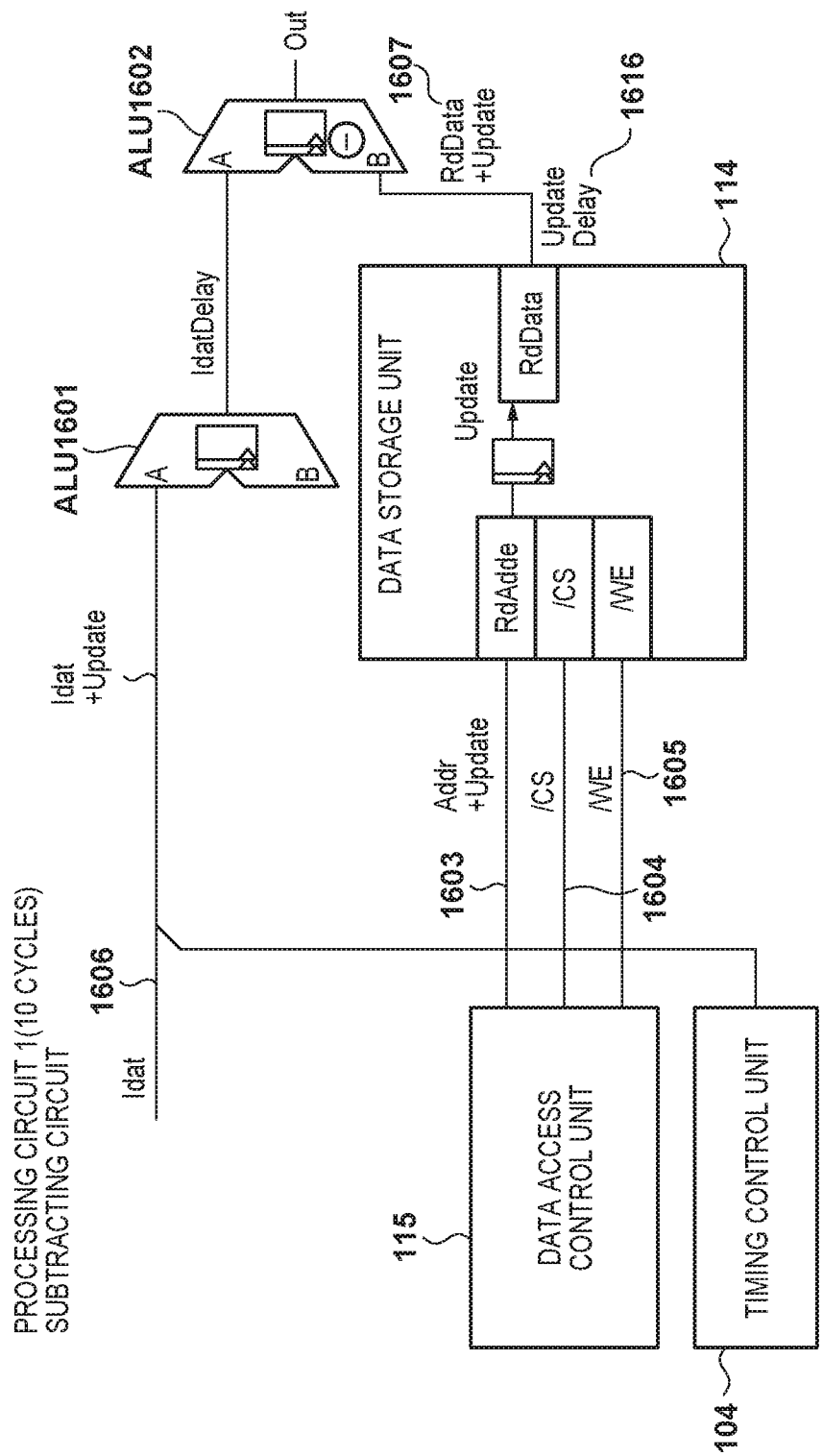
FIG. 16A is a diagram showing propagation of a rewrite signal when a data storage unit is used in the sixth embodiment.
Figure 16B:
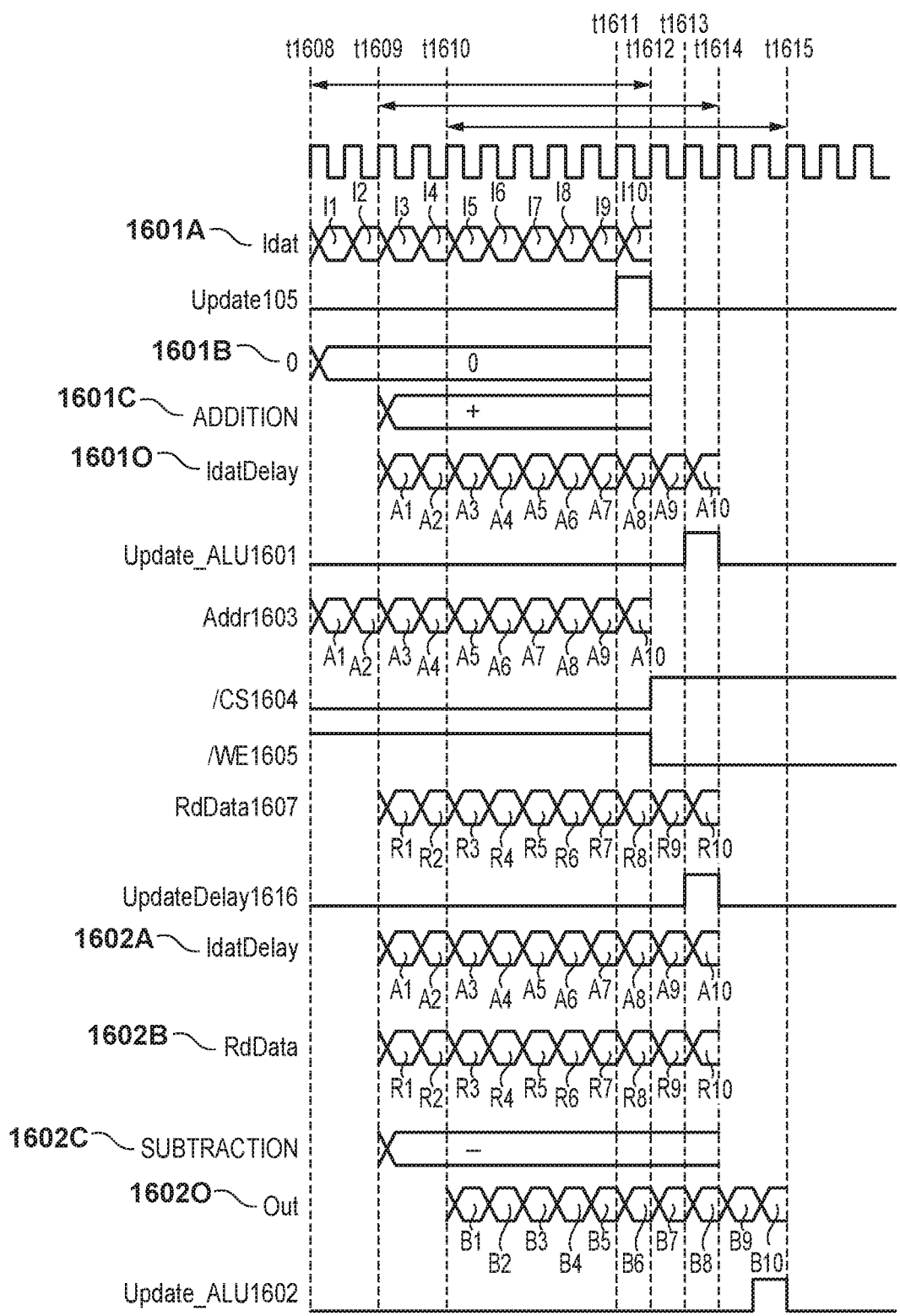
FIG. 16B is a timing chart of a configuration of FIG. 16A.

FIG. 16A is a diagram exemplarily showing propagation of the rewrite signal 105 when the data storage unit 114 is used in the present sixth embodiment, and FIG. 16B is a timing chart thereof. FIG. 16A exemplarily shows processing for subtracting an offset value held in the data storage unit 114 from input data Idat 1606. FIG. 16B shows a timing chart of respective signals.

An ALU 1601 functions as a delay element that delays the input data Idat 1606, and an ALU 1602 operates as a subtractor that subtracts an offset value from the input data Idat 1606.

In reading out data from the data storage unit 114, which is the SRAM and the like, a read address Addr 1603, a chip select signal/CS 1604 that selects the data storage unit 114, and a request signal/WE 1605 are output from the data access control unit 115.

The read address Addr 1603 is an address indicating the location of data to be read out. The chip select signal/CS 1604 selects the data storage unit 114. The chip select signal/CS 1604 is a negative logic; when the chip select signal/CS 1604 is Low, the data storage unit 114 is selected, and the input of Addr 1603 and the request signal/WE 1605 is enabled. The request signal/WE 1605 is a signal that permits reading/writing with respect to a device. The request signal/WE 705 is a negative logic; a write access and a read access are enabled when the request signal/WE 1605 is Low and High, respectively.

In the present sixth embodiment, the rewrite signal 105 output from the timing control unit 104 is issued at a timing t1611, and propagated in synchronization with the input data and the read address 1603. The data storage unit 114 delays the rewrite signal 105 by a predetermined delay amount, and propagates the same in synchronization with read data. The predetermined delay amount is a delay amount that is required from when a read request is made until when data of the data storage unit 114 is read out (hereinafter referred to as a readout delay amount). In the present sixth embodiment, the readout delay amount is two cycles. Therefore, a rewrite signal UpdateDelay 1616, which is propagated in synchronization with the read data RdData 1607, becomes High at a timing t1613. In this way, the rewrite signal is propagated from the data storage unit 114 in synchronization with the read data RdData 1607, thereby making it possible to rewrite a register on the B input side of the ALU 1602.

Although the rewrite signal 105 is propagated in synchronization with the read address 1603 in the present embodiment, it may be propagated in synchronization with the chip select signal/CS 1604. It may also be propagated in synchronization with the request signal/WE 1605.

As described above, according to the present sixth embodiment, the rewrite signal 105 is propagated in synchronization with a data signal and a control signal that controls the data storage unit 114, thereby making it possible to provide a signal processing apparatus that can rewrite circuit information in a pipeline and improve throughput of a programmable circuit.

Although the primary registers and the secondary registers are configured using shift registers in the present sixth embodiment, no limitation is intended in this regard. For example, the foregoing two types of registers may be configured as banking registers. In this case, the present embodiment can be applied while using registers that are not currently used, which are determined based on the issuance of the rewrite signal 105, as primary registers Seventh Embodiment Next, a seventh embodiment of the present invention is described. Although the data storage unit 114 delays the rewrite signal 105 by an amount equal to the readout delay amount and propagates the same in synchronization with read data in the above-described sixth embodiment, a different delay amount may be used. The present seventh embodiment differs from the sixth embodiment in that a delay amount of the rewrite signal 105 propagated to the data storage unit 114 can be propagated at an arbitrary timing in synchronization with read data. Note that as other constituents according to the present seventh embodiment are similar to those of the sixth embodiment, their descriptions are omitted.

Figure 17A:
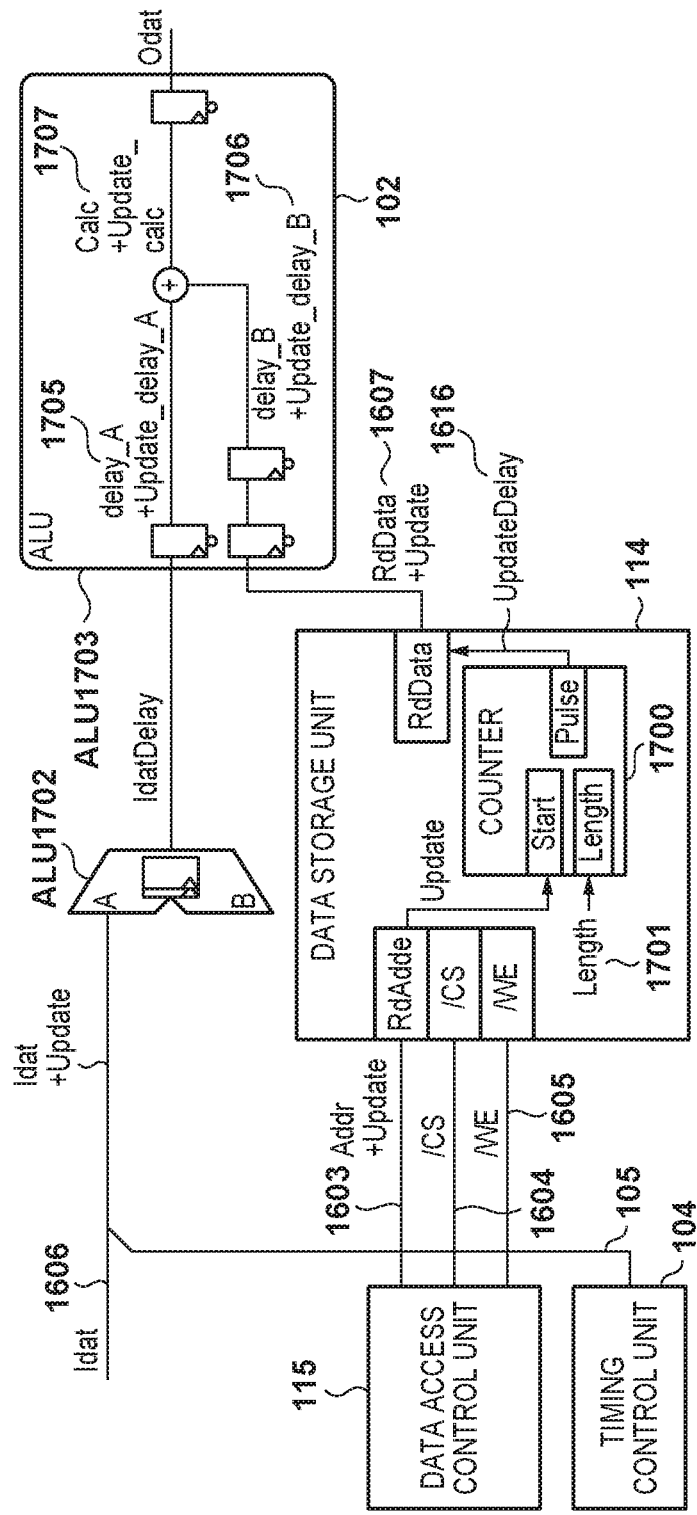
FIG. 17A is a diagram showing propagation of a rewrite signal when a data storage unit is used in a seventh embodiment.
Figure 17B:
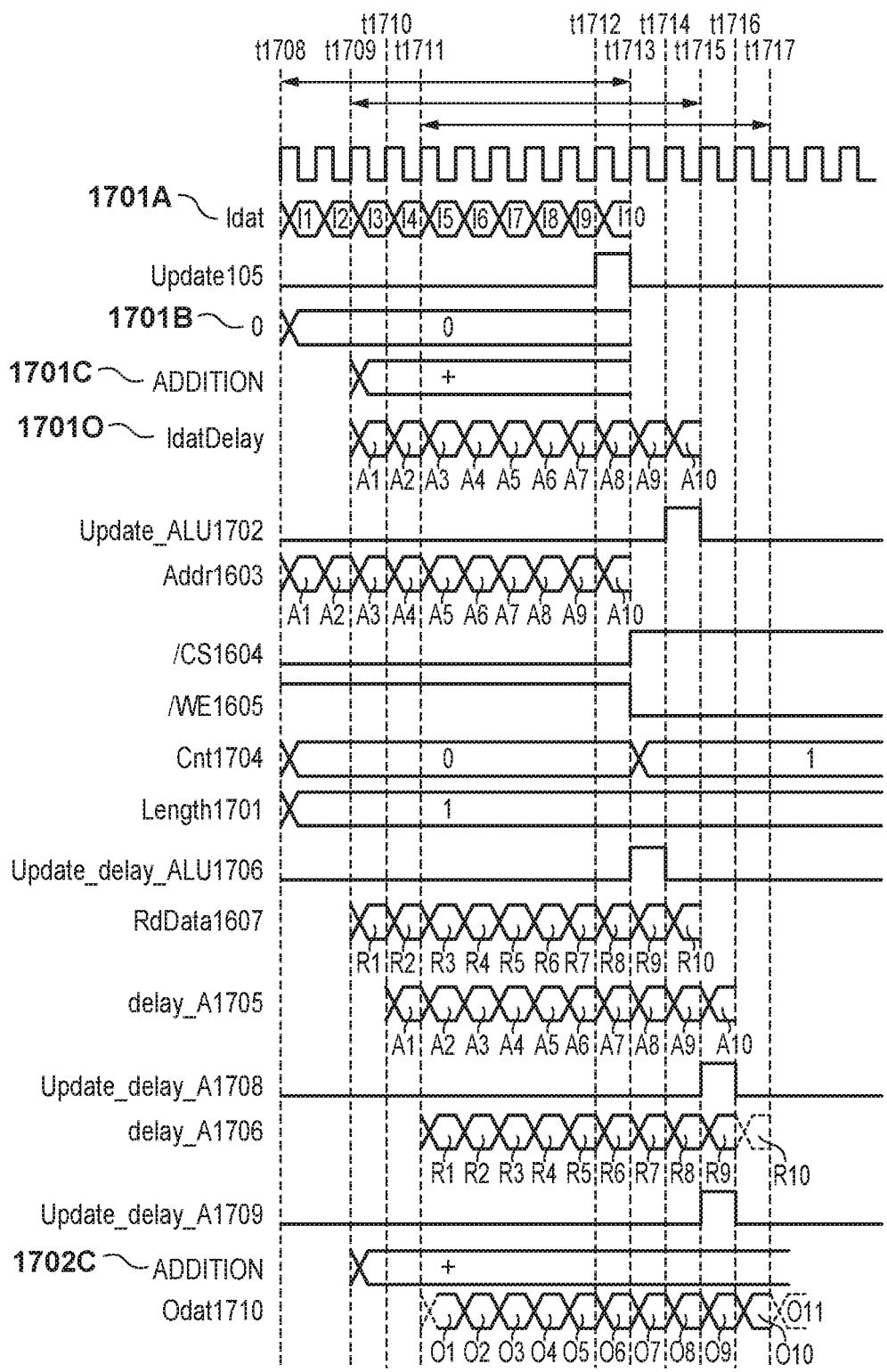
FIG. 17B is a timing chart of a configuration of FIG. 17A.

FIG. 17A is a diagram showing propagation of a rewrite signal when the data storage unit 114 is used in the present seventh embodiment, and FIG. 17B shows timings thereof. FIG. 17A exemplarily shows addition processing for applying an average filter with two taps corresponding to image data of a previous frame stored in the data storage unit 114 and input data. In the present embodiment, the data storage unit 114 further includes a counter 1700. The counter 1700 starts counting upon propagation of a rewrite signal 105 that has been propagated to the data storage unit 114, and issues a rewrite signal UpdateDelay 1616 and propagates the same in synchronization with read data RdData 1607 after counting for a duration of a predetermined delay amount Length 1701. In FIG. 17A, as Length 1701 is set to 1, counting is started at a timing t1711, and the rewrite signal UpdateDelay 161 is issued and propagated in synchronization with the read data one cycle later, that is to say, at a timing t1712. While a readout delay in the data storage unit 114 is two, UpdateDelay 1616 is issued with a delay of one cycle; thus, propagation of the rewrite signal is accelerated by one cycle.

When the phases of input signals are shifted as in the two-tap average filter, data of the computation result contains invalid data. In an ALU 1703 that performs addition processing for the two-tap average filter, a B-side input signal is delayed by one cycle compared to an A-side input signal, and at a timing t1716, an invalid computation result is output due to the absence of the A-side input signal; as a result, it is difficult to improve throughput. On the other hand, according to the present embodiment, as propagation of the rewrite signal 105 issued from the data storage unit 114 is accelerated by one cycle, switching to the next processing circuit is performed after performing computation until a timing t1716 corresponding to a valid data area; thus, invalid computation is not performed. In this way, throughput can be improved.

Furthermore, although a counter is used to propagate the rewrite signal that has been propagated to the data storage unit 114 at an arbitrary timing in synchronization with read data in the present embodiment, a configuration of a shift register may be used to realize the same.

As described above, according to the present embodiment, as a rewrite signal is propagated in synchronization with a data signal, configuration information is rewritten in a pipeline, thereby making it possible to improve throughput of a programmable circuit.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-73720, filed Apr. 8, 2019 which is hereby incorporated by reference herein in its entirety.

What is claimed is:

1. A processing apparatus comprising:
a programmable circuit having ALUs (Arithmetic and Logic Units) including a first ALU and a second ALU that is located on a downstream side compared to the first ALU, and configured to perform first data processing and second data processing; and
an updating unit configured to update the first ALU and the second ALU, so as to switch the programmable circuit from a first circuit setting for the first data processing to a second circuit setting for the second data processing,
wherein, in case of switching the programmable circuit from the first circuit setting to the second circuit setting after the programmable circuit has executed the first data processing under the first circuit setting, the updating unit updates the first ALU at a timing at which last data of the first data processing is output from the first ALU, and updates the second ALU at a timing at which the last data is output from the second ALU.

2. The apparatus according to claim 1, further comprising:
a holding unit configured to hold configuration information for switching the programmable circuit from the first circuit setting for the first data processing to the second circuit setting for the second data processing, and the timing information indicating a period until processing data of the first ALU is output from the second ALU; wherein the update unit updates the first ALU and the second ALU based on the configuration information and the timing information.

3. The apparatus according to claim 2, wherein
the programmable circuit includes
an SRAM used as a working area, and
a control unit configured to control an address, reading, and writing of the SRAM based on the configuration information in order to supply data of the SRAM to the ALUs.

4. The apparatus according to claim 1, wherein
when a delay amount generated in data processing of the second ALU under the first circuit setting is smaller than a delay amount of the first ALU, the updating unit stops propagation of data to be processed in accordance with a difference between the delay amount of the first ALU and the delay amount of the second ALU.

5. The apparatus according to claim 1, wherein
when a delay amount generated in data processing of the second ALU under the first circuit setting is larger than a delay amount of the first ALU, the updating unit generates a control signal indicating whether data to be processed is valid or invalid in accordance with a difference between the delay amount of the first ALU and the delay amount of the second ALU.

6. The apparatus according to claim 1, wherein
the updating unit updates each ALU in accordance with a signal that is propagated in synchronization with data to be processed by each ALU.

7. The apparatus according to claim 1, wherein
the updating unit includes a plurality of pulse generators that generate updating signals with respect to a plurality of consecutively-connected ALUs in accordance with delay amounts of the respective ALUs, and supplies the signals generated by the plurality of pulse generators as signals for updating the respective ALUs.

8. The apparatus according to claim 1, wherein
ALUs that are in a parallel relationship are updated in accordance with a signal generated by one pulse generator.

9. A method of controlling a processing apparatus that comprises a programmable circuit having ALUs (Arithmetic and Logic Units) including a first ALU and a second ALU that is located on a downstream side compared to the first ALU, and configured to perform first data processing and second data processing, the method comprising:

updating the first ALU and the second ALU, so as to switch the programmable circuit from a first circuit setting for the first data processing to a second circuit setting for the second data processing, wherein, in case of switching the programmable circuit from the first circuit setting to the second circuit setting after the programmable circuit has executed the first data processing under the first circuit setting, in the updating the first ALU is updated at a timing at which last data of the first data processing is output from the first ALU, and the second ALU is updated at a timing at which the last data is output from the second ALU.

10. A non-transitory computer-readable storage medium storing a program which, when read and executed by a computer, causes the computer to execute steps of a method of controlling a processing apparatus that comprises a programmable circuit having ALUs (Arithmetic and Logic Units) including a first ALU and a second ALU that is located on a downstream side compared to the first ALU, and configured to perform first data processing and second data processing, the method comprising:

updating the first ALU and the second ALU, so as to switch the programmable circuit from a first circuit setting for the first data processing to a second circuit setting for the second data processing, wherein, in case of switching the programmable circuit from the first circuit setting to the second circuit setting after the programmable circuit has executed the first data processing under the first circuit setting, in the updating the first ALU is updated at a timing at which last data of the first data processing is output from the first ALU, and the second ALU is updated at a timing at which the last data is output from the second ALU.

* * * * *